(12) United States Patent
Morita et al.

(10) Patent No.: US 12,283,592 B2
(45) Date of Patent: Apr. 22, 2025

(54) SEMICONDUCTOR DEVICE AND ELECTRONIC EQUIPMENT

(71) Applicant: SONY SEMICONDUCTOR SOLUTIONS CORPORATION, Kanagawa (JP)

(72) Inventors: Shinya Morita, Kanagawa (JP); Katsuhiko Takeuchi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 381 days.

(21) Appl. No.: 17/755,355

(22) PCT Filed: Oct. 15, 2020

(86) PCT No.: PCT/JP2020/038900
§ 371 (c)(1),
(2) Date: Apr. 27, 2022

(87) PCT Pub. No.: WO2021/090657
PCT Pub. Date: May 14, 2021

(65) Prior Publication Data
US 2022/0399329 A1    Dec. 15, 2022

(30) Foreign Application Priority Data
Nov. 5, 2019  (JP) .................. 2019-200539

(51) Int. Cl.
*H01L 27/06* (2006.01)
*H01L 29/20* (2006.01)
(Continued)

(52) U.S. Cl.
CPC ...... *H01L 27/0605* (2013.01); *H01L 27/0629* (2013.01); *H01L 28/60* (2013.01); *H01L 29/2003* (2013.01); *H01L 29/7786* (2013.01)

(58) Field of Classification Search
CPC . H01L 27/0605; H01L 27/0629; H01L 28/60; H01L 29/2003; H01L 29/7786;
(Continued)

(56) References Cited

U.S. PATENT DOCUMENTS

2015/0263001 A1   9/2015  Saito et al.
2019/0393374 A1* 12/2019  Rämer .................. H01Q 9/28

FOREIGN PATENT DOCUMENTS

CN       104916642 A     9/2015
DE   102017103687 B3    4/2018
(Continued)

OTHER PUBLICATIONS

International Search Report and Written Opinion of PCT Application No. PCT/JP2020/038900, issued on Dec. 28, 2020, 11 pages of ISRWO.

*Primary Examiner* — Ermias T Woldegeorgis
(74) *Attorney, Agent, or Firm* — CHIP LAW GROUP

(57) ABSTRACT

A semiconductor device includes a semiconductor material layer forming a channel layer, a pair of source/drain electrodes formed on the semiconductor material layer, and a gate electrode arranged between the pair of source/drain electrodes and formed on the semiconductor material layer via a gate insulating film. The semiconductor device further includes a connection path using a capacitor in which an insulating film formed in the same layer as the gate insulating film is sandwiched by a pair of electrodes. The capacitor undergoes dielectric breakdown at a voltage lower than a dielectric breakdown voltage of the gate insulating film is formed between at least one of the pair of source/drain electrodes and the gate electrode.

7 Claims, 20 Drawing Sheets

(51) Int. Cl.
*H01L 29/778* (2006.01)
*H01L 49/02* (2006.01)

(58) Field of Classification Search
CPC . H01L 21/8252; H01L 29/94; H01L 21/3205; H01L 21/768; H01L 23/532; H01L 29/78
See application file for complete search history.

(56) References Cited

FOREIGN PATENT DOCUMENTS

| | | | | |
|---|---|---|---|---|
| EP | 3449508 A1 | | 3/2019 | |
| JP | 57143865 A | * | 9/1982 | ......... H01L 27/0251 |
| JP | 05-291309 A | | 11/1993 | |
| JP | 2001-284579 A | | 10/2001 | |
| JP | 2015-173237 A | | 10/2015 | |
| JP | 2016-195195 A | | 11/2016 | |
| JP | 2020-510323 A | | 4/2020 | |
| WO | 2018/153557 A1 | | 8/2018 | |

* cited by examiner

SEMICONDUCTOR DEVICE AND ELECTRONIC EQUIPMENT

CROSS REFERENCE TO RELATED APPLICATIONS

This application is a U.S. National Phase of International Patent Application No. PCT/JP2020/038900 filed on Oct. 15, 2020, which claims priority benefit of Japanese Patent Application No. JP 2019-200539 filed in the Japan Patent Office on Nov. 5, 2019. Each of the above-referenced applications is hereby incorporated herein by reference in its entirety.

FIELD

The present disclosure relates to a semiconductor device and electronic equipment.

BACKGROUND

Gallium nitride (GaN) as a wide-bandgap semiconductor material is characterized by having a high dielectric breakdown voltage, being capable of high-temperature operation, having a high saturation drift velocity, for example. In addition, two-dimensional electronic gas (2DEG) formed at a GaN heterojunction is characterized by having a high mobility and a high sheet electron density. Thanks to these characteristics, GaN-based hetero-FETs can operate with a low resistance, a high speed, and a high withstand voltage, and are expected to be applied to power devices, RF devices, and the like.

In cases of common GaN-based hetero-FETs (HFETs), a barrier layer is disposed over a GaN layer forming a channel layer. In order to generate 2DEG by polarization at the interface with the channel layer, $Al_{1-x-y}Ga_xIn_yN$ (where $0 \leq x < 1$, $0 \leq y < 1$), for example, is commonly used as a material for forming the barrier layer. The composition is appropriately selected such that favorable characteristics can be achieved, and it is commonly known that leakage current at a Schottky junction formed between the gate electrode and the barrier layer may be increased depending on the composition. In that case, the leakage current can be reduced by arranging the gate electrode via a gate insulating film.

In the manufacturing process of a semiconductor device, a phenomenon called plasma induced damage (PID) occurs, in which damage is caused by an electric charge charged in a conductive layer wiring, during a manufacturing step such as plasma etching. Thus, it has been proposed to connect a capacitor having a low withstand voltage to the gate electrode so that the charged electric charge is released by dielectric breakdown of the low-withstand voltage capacitor (see Patent Literature 1, for example).

CITATION LIST

Patent Literature

Patent Literature 1: JP 2001-284579 A

SUMMARY

Technical Problem

In the case of forming the low-withstand voltage capacitor by using an insulating film formed in the same layer as the gate insulating film, it is necessary to perform a process of thinning a portion of the insulating film from which the capacitor is formed, for example. However, the gate insulating film is formed as a very thin film. Thus, in order to realize a semiconductor device with stable performance, it is required to form the gate electrode immediately after forming the gate insulating film to avoid unnecessary damage to the gate insulating film.

Therefore, it is an objective of the present disclosure to provide a semiconductor device in which a capacitor with a low withstand voltage can be formed by using an insulating film formed in the same layer as a gate insulating film without partial thinning, and electronic equipment including the semiconductor device.

Solution to Problem

A semiconductor device according to the present invention for achieving the above objective is a semiconductor device including:
  a semiconductor material layer forming a channel layer;
  a pair of source/drain electrodes formed on the semiconductor material layer; and
  a gate electrode arranged between the pair of source/drain electrodes and formed on the semiconductor material layer via a gate insulating film, wherein
  a connection path using a capacitor in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes and the gate electrode.

Electronic equipment according to the present invention for achieving the above objective is electronic equipment including a semiconductor device including:
  a semiconductor material layer forming a channel layer;
  a pair of source/drain electrodes formed on the semiconductor material layer; and
  a gate electrode arranged between the pair of source/drain electrodes and formed on the semiconductor material layer via a gate insulating film, wherein
  a connection path using a capacitor in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes and the gate electrode.

DESCRIPTION OF EMBODIMENTS

Figure 1:
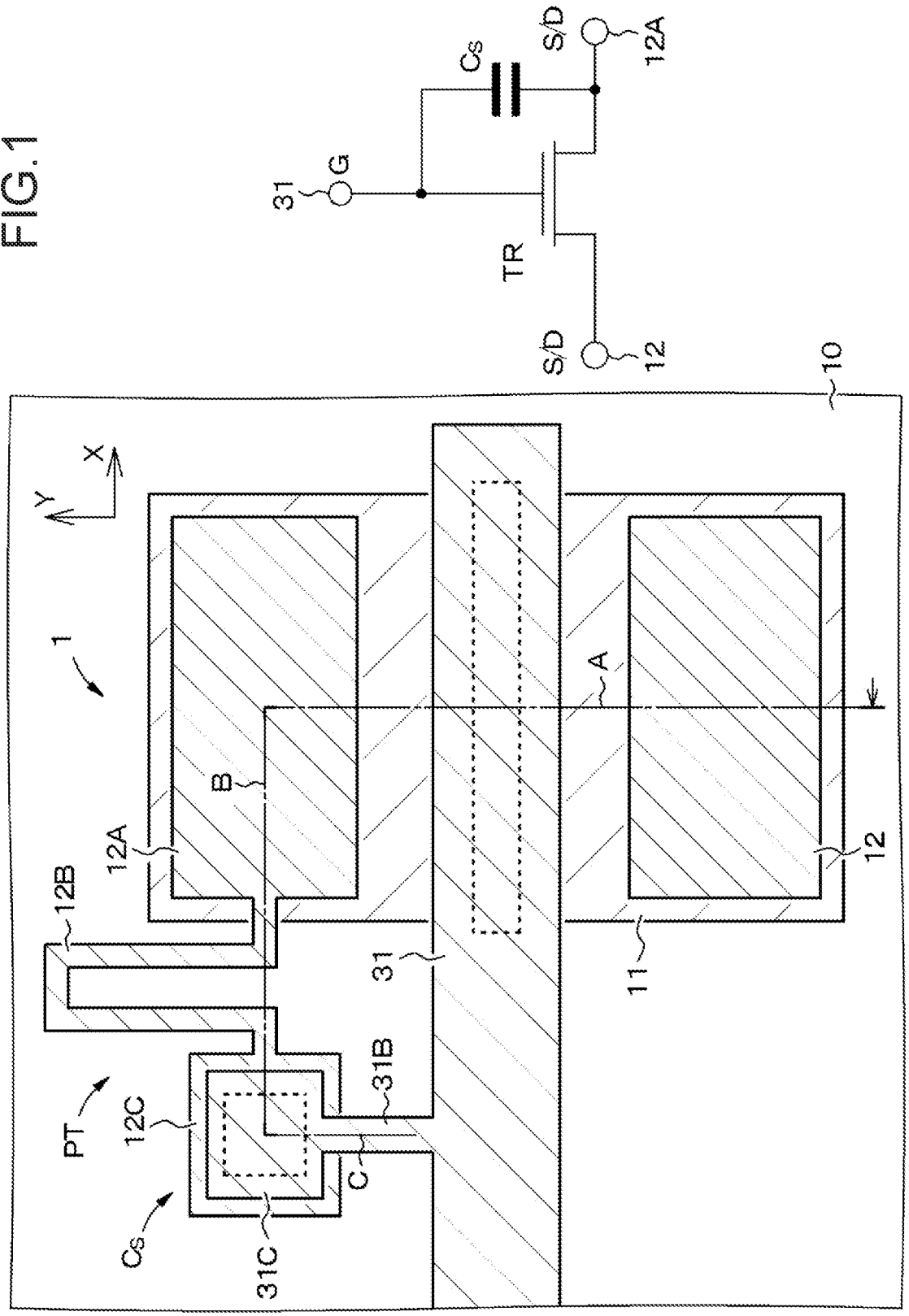
FIG. 1 is a schematic partial plan view for illustrating a configuration of a semiconductor device according to a first embodiment of the present disclosure.

The present disclosure will be described below based on embodiments with reference to the drawings. The present disclosure is not limited to the embodiments, and various numerical values and materials in the embodiments are illustrative. In the following description, identical elements or elements having identical functions are given the same reference character, and repeated descriptions are omitted. Note that the description will be made in the following order.
1. General Description of Semiconductor Device and Manufacturing Method of Semiconductor Device and Electronic Equipment according to Present Disclosure
2. First Embodiment
3. Second Embodiment
4. Third Embodiment
5. Description of Electronic Equipment
6. Application Examples
7. Others General Description of Semiconductor Device and Manufacturing Method of Semiconductor Device and Electronic Equipment According to Present Disclosure In the following description, a semiconductor device according to the present disclosure, a semiconductor device manufactured by a semiconductor device manufacturing method according to the present disclosure, and a semiconductor device provided to electronic equipment according to the present disclosure may be simply referred to as "a semiconductor device of the present disclosure"

As described above, a semiconductor device of the present disclosure is a semiconductor device including:
a semiconductor material layer forming a channel layer;
a pair of source/drain electrodes formed on the semiconductor material layer; and
a gate electrode arranged between the pair of source/drain electrodes and formed on the semiconductor material layer via a gate insulating film, wherein
a connection path using a capacitor in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes and the gate electrode.

The semiconductor device of the present disclosure can have a configuration in which a conductive material layer constituting the source/drain electrodes is made of a metal material. In this case, a configuration can be provided in which one of the pair of electrodes forming the capacitor is formed by using a conductive material layer formed in the same layer as the conductive material layer constituting the source/drain electrodes, and has formed thereon the insulating film forming the capacitor.

The semiconductor device of the present disclosure including the preferred configuration described above can have a form in which the other of the pair of electrodes forming the capacitor can be formed by using a conductive material layer formed in the same layer as a conductive material layer constituting the gate electrode.

Alternatively, the semiconductor device of the present disclosure can have a configuration in which one of the pair of electrodes forming the capacitor is composed of a semiconductor material electrode formed in the same layer as the semiconductor material layer forming the channel layer, and has formed thereon the insulating film forming the capacitor,
one end of the semiconductor material electrode is connected to at least one of the pair of source/drain electrodes via an intermediate wiring formed in the same layer as a conductive material layer constituting the source/drain electrodes, and
a width between an end portion of the intermediate wiring and an end portion of the other electrode of the capacitor is set to be narrower than a width between an end portion of the source/drain electrodes and an end portion of the gate electrode.

The semiconductor device of the present disclosure including various preferred configurations described above can have a configuration in which a process of electrically interrupting the connection path is performed. In this case, a configuration can be provided in which the electrically interrupting process is performed by removing a part of the connection path. Alternatively, a configuration can be provided in which the electrically interrupting process is performed by increasing a resistance of a part of the connection path. In this case, a configuration can be provided in which a part of the connection path is formed by using a semiconductor material layer, and the part of the connection path formed from the semiconductor material layer is subjected to ion implantation to increase the resistance.

Alternatively, the semiconductor device of the present disclosure including various preferred configurations described above can have a configuration in which a connection path passing through a capacitor and a resistive element connected in series to the capacitor is formed between at least one of the pair of source/drain electrodes and the gate electrode. In this case, a configuration can be provided in which the resistive element is formed by using a semiconductor material layer formed in the same layer as the semiconductor material layer forming the channel layer.

The semiconductor device of the present disclosure including various preferred configurations described above can have a configuration in which the semiconductor material layer forming the channel layer is made of gallium nitride.

A manufacturing method of a semiconductor device according to the present disclosure includes
forming, between at least one of the pair of source/drain electrodes and the gate electrode, a connection path using a capacitor in which an insulating film formed in the same layer as the gate insulating film is sandwiched by a pair of electrodes and that undergoes dielectric breakdown at a voltage lower than a dielectric breakdown voltage of the gate insulating film.

In this case, performing a process of electrically interrupting the connection path after a final plasma process in the semiconductor manufacturing process ends can be further included.

Alternatively, in this case, forming a connection path passing through a capacitor that undergoes dielectric breakdown at a voltage lower than a dielectric breakdown voltage of the gate insulating film and a resistive element connected in series to the capacitor can be further included.

Electronic equipment including the semiconductor device of the present disclosure can include, for example, a wireless communication device constituting a communication system or the like, a semiconductor module such as an IC constituting them, and the like. For such a wireless communication device, an effect is particularly exerted on one with a communication frequency in or above an ultra high frequency (UHF) band.

Various conditions herein are satisfied not only when they are mathematically rigorously met but also when they are substantially met. Various design or manufacturing variations are allowed. In addition, the figures used in the following description are schematic and do not indicate actual dimensions and their ratios. For example, FIG. 2, which will be seen later, indicates a cross-sectional structure of the semiconductor device, but does not indicate ratios of widths, heights, thicknesses, etc.

First Embodiment

A first embodiment relates to a semiconductor device and a manufacturing method of the semiconductor device and electronic equipment according to the present disclosure.

FIG. 1 is a schematic partial plan view for illustrating a configuration of a semiconductor device according to the first embodiment of the present disclosure. More specifically, one of a number of semiconductor devices formed on a wafer substrate is illustrated. The same applies to the other figures seen later. Note that an equivalent circuit diagram of the semiconductor device is illustrated on the right side of FIG. 1.

A semiconductor device 1 according to the first embodiment includes:
a semiconductor material layer 11 forming a channel layer;
a pair of source/drain electrodes 12 and 12A formed on the semiconductor material layer 11; and
a gate electrode 31 arranged between the pair of source/drain electrodes 12 and 12A and formed on the semiconductor material layer 11 via a gate insulating film. The semiconductor device 1 is a field-effect transistor having an insulated-gate structure. In FIG. 1, the plan shapes of elements are hatched. Note that, for convenience of illustration, the gate insulating film is not illustrated in FIG. 1. The gate insulating film and an insulating film formed in the same layer as the gate insulating film will be described in detail later with reference to FIG. 2, which will be seen later.

In addition, a connection path PT using a capacitor $C_s$ in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes 12 and 12A (in the example illustrated in the figure, the source/drain electrode 12A) and the gate electrode 31.

Figure 2:
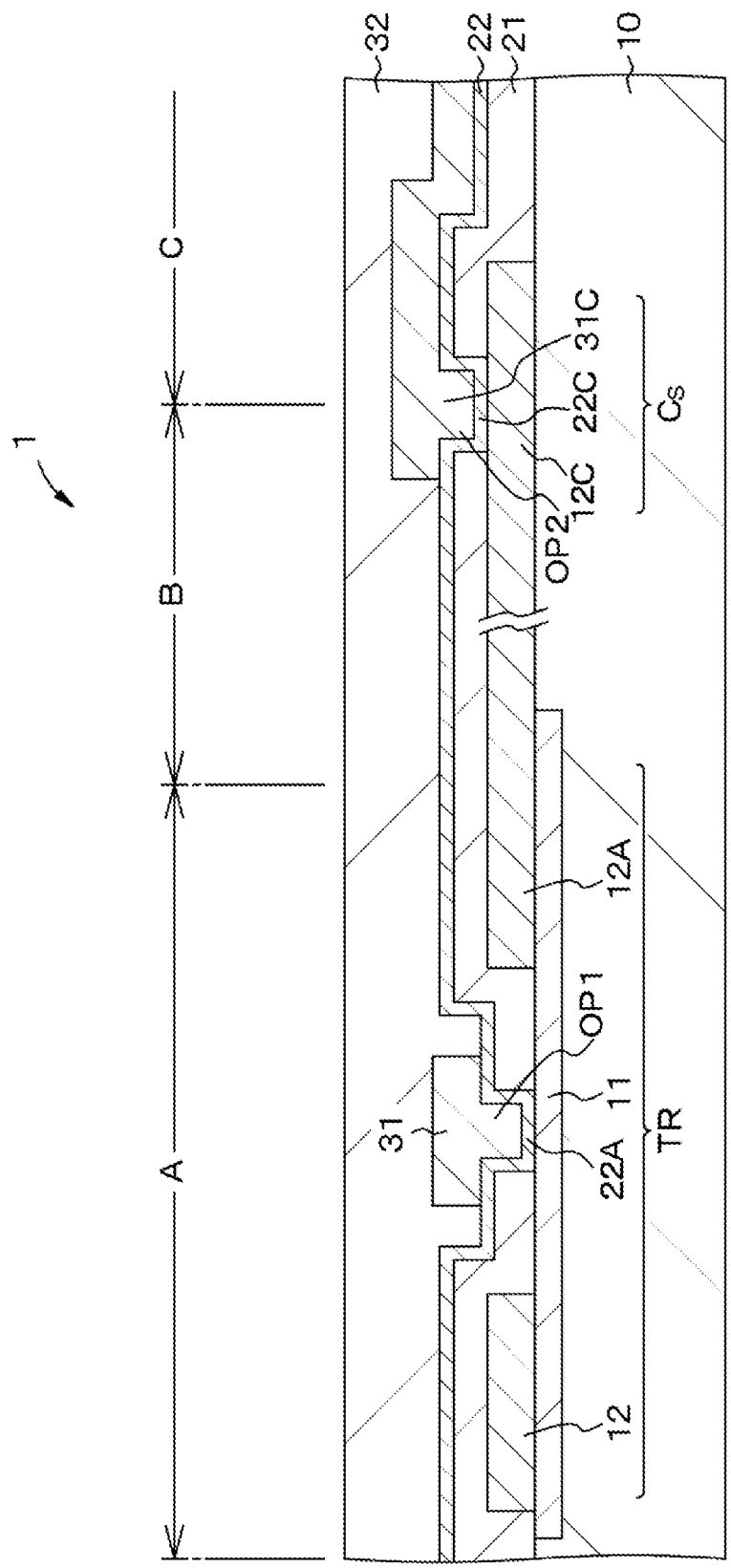
FIG. 2 is a schematic partial sectional view for illustrating the configuration of the semiconductor device according to the first embodiment of the present disclosure.

FIG. 2 is a schematic partial sectional view for illustrating the configuration of the semiconductor device according to the first embodiment of the present disclosure. More specifically, portions with reference characters A, B, and C indicated by long dashed short dashed lines in FIG. 1 are schematically illustrated in cross section. For convenience of illustration, the dimensions of components in FIG. 2 may be different from the dimensions illustrated in FIG. 1. Note that the plan shapes of elements are described with reference to FIGS. 3 to 7 for illustrating a manufacturing method of the semiconductor device as appropriate.

The semiconductor device 1 is formed on a substrate 10. The semiconductor material layer 11 forming a channel layer is formed on the substrate 10. The substrate 10 is formed from a monocrystalline GaN substrate, for example, in consideration of its lattice constant relationship with the semiconductor material layer 11 formed thereon. The hatched portion in FIG. 3 indicates the plan shape of the semiconductor material layer 11.

The semiconductor material layer 11 is made of gallium nitride (GaN), and an epitaxially-grown layer of GaN is used, for example. The semiconductor material layer 11 is formed as a u-GaN layer to which impurities are not added. A barrier layer, not illustrated in the figure, is formed on the semiconductor material layer 11. In order to generate 2DEG by polarization at the interface with the semiconductor material layer 11, $Al_{1-x-y}Ga_xIn_yN$ (where $0 \leq x < 1$, $0 \leq y < 1$), for example, is commonly used as a material for forming the barrier layer.

Note that, if the material constituting the substrate 10 and the material constituting the semiconductor material layer 11 have different lattice constants, a buffer layer may be provided between them. Controlling the lattice constants by the buffer layer allows a favorable crystal condition of the semiconductor material layer 11 and warpage of the wafer substrate to be controlled. For example, if the substrate 1 is made of monocrystalline silicon, AlN, AlGaN, GaN, or the like is used as an example of such buffer layer.

Figure 3:
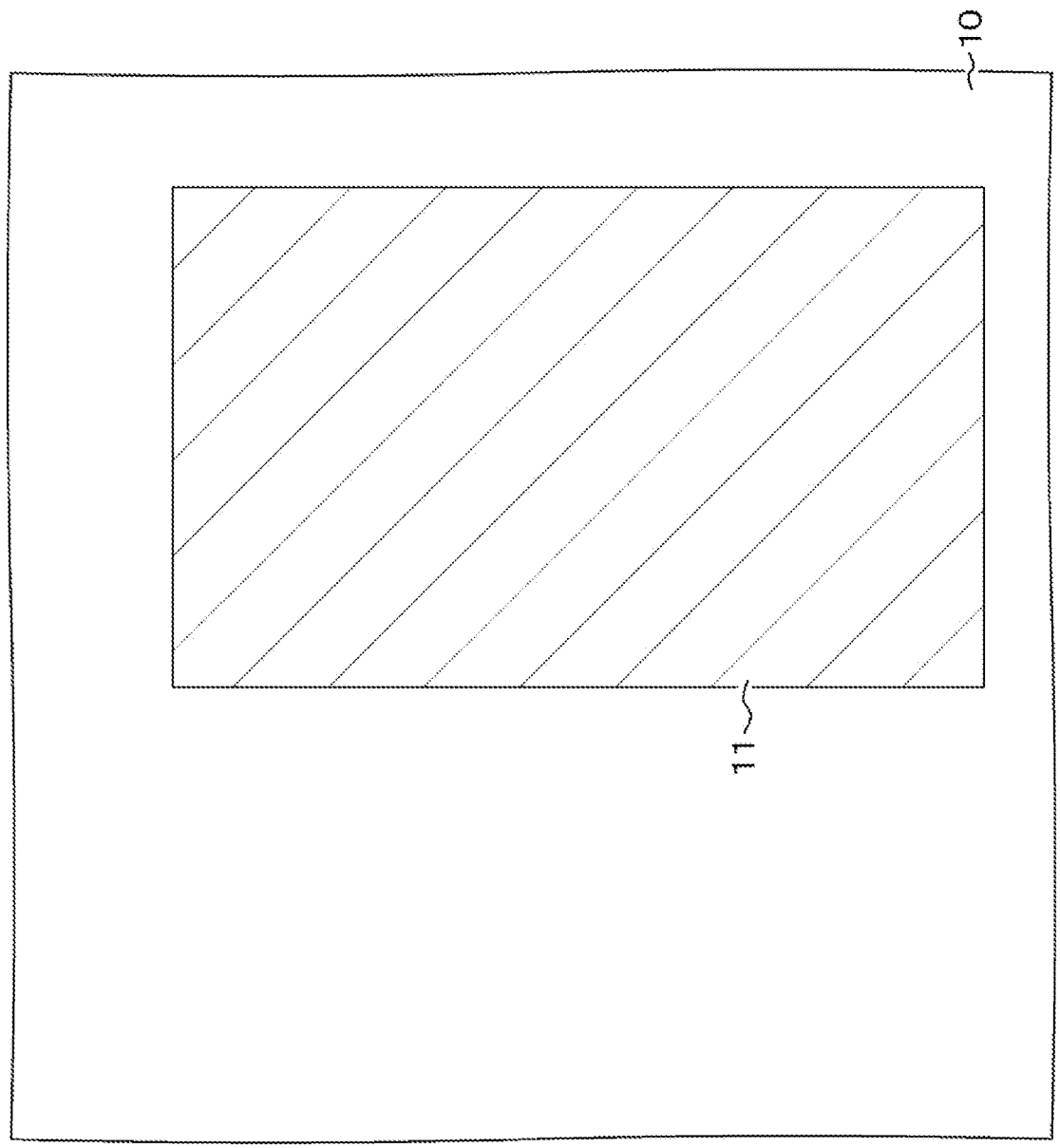
FIG. 3 is a schematic partial plan view for illustrating a manufacturing method of the semiconductor device according to the first embodiment of the present disclosure.

As illustrated in FIG. 3, the plan shape of the semiconductor material layer 11 is substantially rectangular. As illustrated in FIGS. 1 and 2, the pair of source/drain electrodes 12 and 12A are formed on the semiconductor material layer 11. The hatched portions in FIG. 4 indicate the plan shape of the pair of source/drain electrodes 12 and 12A. The portions indicated by reference characters 12B and 12C will be described later. A conductive material layer constituting the source/drain electrodes 12 and 12A is made of a metal material and is formed from, for example, a metal such as aluminum (Al), copper (Cu), or gold (Au), an alloy containing them as main components, or the like.

Figure 4:
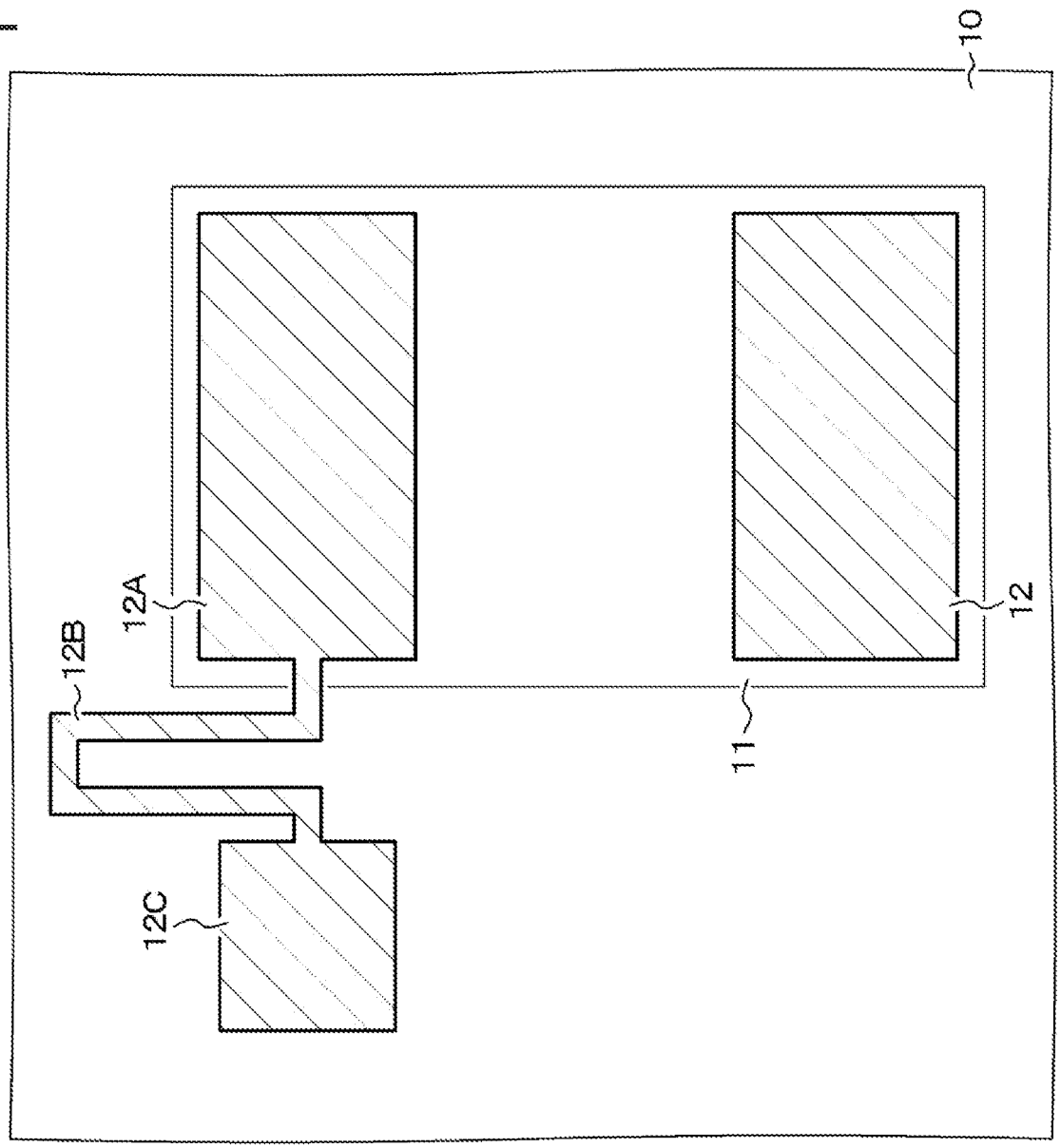
FIG. 4 is a schematic partial plan view for illustrating the manufacturing method of the semiconductor device according to the first embodiment of the present disclosure, continued from FIG. 3.

An electrode 12C, which is one of the pair of electrodes forming the capacitor $C_s$, is formed by using a conductive material layer formed in the same layer as the conductive material layer constituting the source/drain electrodes 12 and 12A. In addition, as illustrated in FIGS. 1, 2, and 4, the one electrode 12C is connected to the source/drain electrode 12A via an intermediate wiring 12B. The intermediate wiring 12B is also formed by using the conductive material layer formed in the same layer as the conductive material layer constituting the source/drain electrodes 12 and 12A. The pair of source/drain electrodes 12 and 12A, the intermediate wiring 12B, and the one electrode 12C of the capacitor $C_s$ are formed by appropriately patterning the conductive material layer formed in the same layer, for example.

Figure 5:
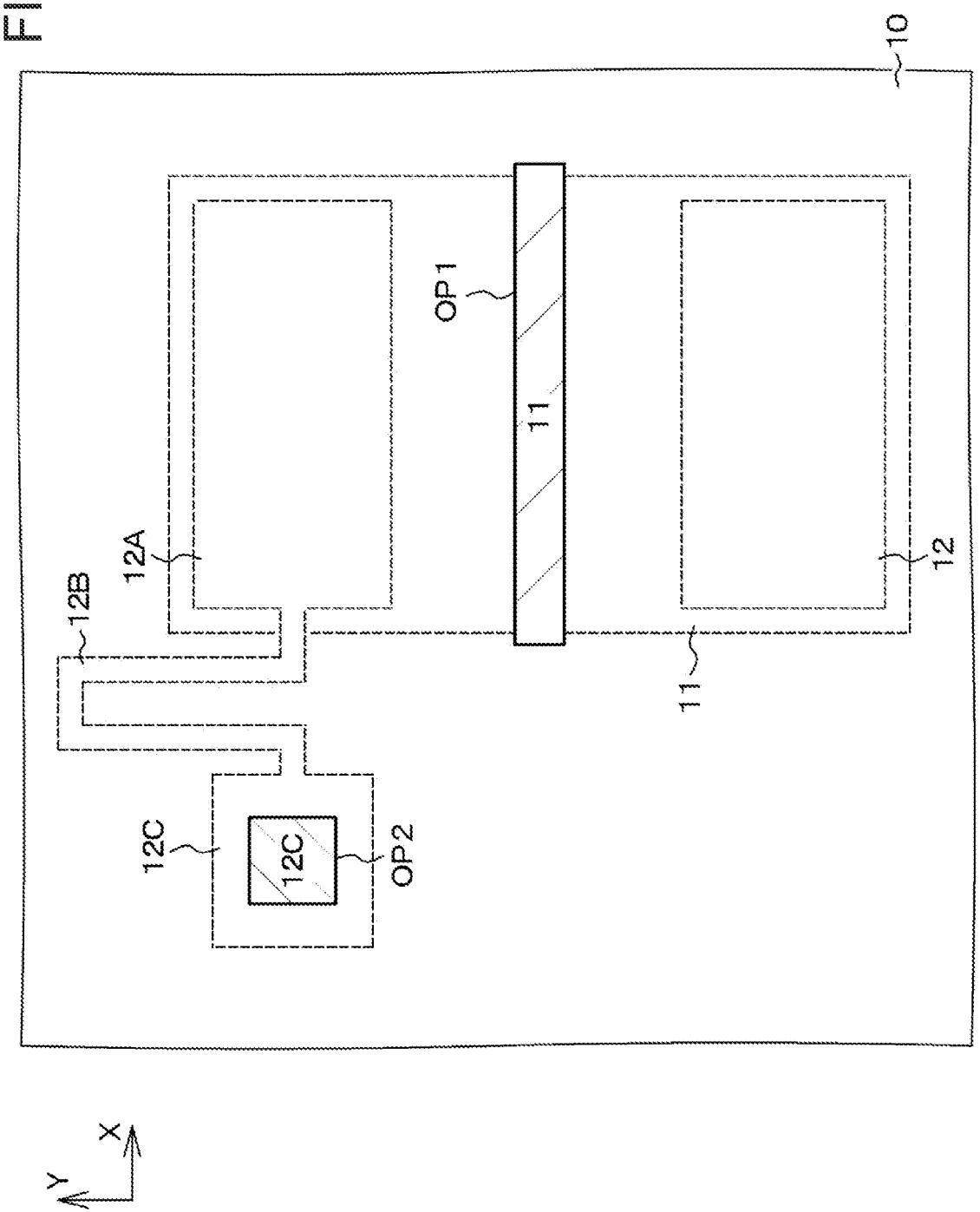
FIG. 5 is a schematic partial plan view for illustrating the manufacturing method of the semiconductor device according to the first embodiment of the present disclosure, continued from FIG. 4.

As illustrated in FIG. 2, an interlayer insulating layer 21 is formed on the entire surface including the pair of source/drain electrodes 12 and 12A, the intermediate wiring 12B, and the one electrode 12C. As illustrated in FIGS. 2 and 5, an opening OP1 from which the semiconductor material layer 11 below the gate electrode 31 is exposed and an opening OP2 from which a part of the one electrode 12C of the capacitor $C_s$ is exposed are provided in the interlayer insulating layer 21. In FIG. 5, the portion of the semiconductor material layer 11 exposed by the opening OP1 and the portion of the electrode 12C exposed by the opening OP2 are hatched.

As illustrated in FIG. 2, an insulating film 22, which constitutes the gate insulating film, is formed over the entire surface including the interlayer insulating layer 21 and the openings OP1 and OP2. The insulating film 22 is formed of aluminum oxide ($Al_2O_3$), hafnium oxide ($HfO_2$), a lamination thereof, or the like with a thickness of around 10 nanometers, for example. The portion of the insulating film 22 formed in the opening OP1 constitutes a gate insulating film 22A. The portion of the insulating film 22 formed in the opening OP2 constitutes an insulating film 22C, used for the capacitor $C_s$.

The gate electrode 31 is formed to cover the gate insulating film 22A formed in the opening OP1. As illustrated in FIG. 1, the gate electrode 31 is arranged between the pair of source/drain electrodes 12 and 12A and is formed on the semiconductor material layer 11 via the gate insulating film 22A. The hatched portion in FIG. 6 indicates the plan shape of the gate electrode 31. The portions indicated by reference characters 31B and 31C will be described later. The gate electrode 31 is formed by using a material similar to the conductive material constituting the pair of source/drain electrodes 12 and 12A, for example. An insulating planarization film 32 is formed on the entire surface including the gate electrode 31.

An electrode 31C, which is the other of the pair of electrodes forming the capacitor $C_s$, is formed by using a conductive material layer formed in the same layer as the conductive material layer constituting the gate electrode 31. The capacitor $C_s$ is formed by sandwiching the insulating film 22C, which is in the same layer as the gate insulating film, between the one electrode 12C and the other electrode 31C described above. The other electrode 31C and the gate electrode 31 are connected by an intermediate wiring 31B extending from the gate electrode 31. The gate electrode 31, the intermediate wiring 31B, and the other electrode 31C of the capacitor $C_s$ are formed by appropriately patterning the conductive material layer formed in the same layer, for example.

The capacitor $C_s$ formed as described above is configured to undergo dielectric breakdown at a voltage lower than the dielectric breakdown voltage of the gate insulating film 22C.

As illustrated in FIG. 2, the insulating film 22C used for the capacitor $C_s$ is formed on the one electrode 12C. In contrast, the gate insulating film 22A is formed on the semiconductor material layer 11. Here, the one electrode 12C is formed by using the conductive material layer forming the source/drain electrodes 12 and 12A. Therefore, the one electrode 12C has a greater surface roughness than the semiconductor material layer 11. The insulating film 22C, which is formed on the one electrode 12C having the greater surface roughness, is affected by the roughness of the underlying layer, and thus has a lowered uniformity in its film thickness and shape. In particular, a portion that is locally thinner or a portion at which electric fields are concentrated tends to become a starting point of dielectric breakdown. Therefore, the breakdown voltage is decreased as compared to the gate insulating film 22A formed on the semiconductor material layer 11, which is relatively flat.

When the gate electrode 31 is charged during a plasma process such as RIE in the semiconductor device manufacturing process, the insulating film 22C, having the lower breakdown voltage, undergoes breakdown prior to the gate insulating film 22A. Thus, a leakage path is formed between the gate electrode 31 and the source/drain electrode 12A, and therefore voltage applied to the gate insulating film 22A is reduced. Therefore, it is possible to reduce breakdown and performance degradation due to charging during the semiconductor device manufacturing process.

Note that, if a leakage path is formed between the gate electrode 31 and the source/drain electrode 12A, the operation of the semiconductor device 1 as a product is affected. Thus, a process of electrically interrupting the connection path PT is performed at the time of product shipping.

Specifically, the electrical interruption process can be performed by removing a part of the connection path such as by a common wet etching, laser cutting, or dicing process. The portion indicated by reference character 40 in the FIG. 7 indicates the portion on which the interruption process has been performed.

Next, a manufacturing method of the semiconductor device 1 will be described.

As described above, the manufacturing method of the semiconductor device 1 includes
   forming, between at least one of the pair of source/drain electrodes and the gate electrode, a connection path using a capacitor in which an insulating film formed in the same layer as the gate insulating film is sandwiched by a pair of electrodes and that undergoes dielectric breakdown at a voltage lower than a dielectric breakdown voltage of the gate insulating film. The first embodiment further involves performing a process of electrically interrupting the connection path after a final plasma process in the semiconductor manufacturing process ends.

FIGS. 3 to 7 are schematic partial plan views for illustrating a manufacturing method of the semiconductor device according to the first embodiment of the present disclosure. Note that, from the viewpoint of legibility, insulating layers and insulating films are not illustrated in the plan views in principle.

Step—100 (see FIG. 3)

First, the semiconductor material layer 11 forming the channel layer is formed on the substrate 10. Specifically, the substrate 10 is prepared, and the semiconductor material layer 11 is formed thereon by known film formation and patterning methods.

Step—110 (see FIG. 4)

Next, the source/drain electrodes 12 and 12A, the intermediate wiring 12B, and the first electrode 12C are formed. A conductive material layer made of a metal material is formed on the entire surface including the semiconductor material layer 11. Thereafter, the source/drain electrodes 12 and 12A, the intermediate wiring 12B, and the one electrode 12C forming the capacitor $C_s$ are formed at predetermined positions by a patterning method.

Step—120 (see FIG. 5)

Next, the interlayer insulating layer 21 is formed on the entire surface. Thereafter, the opening OP1, from which the portion of the semiconductor material layer 11 positioned below the gate electrode 31 is exposed, and the opening OP2, from which a part of the one electrode 12C of the capacitor $C_s$ is exposed, are provided.

Figure 6:
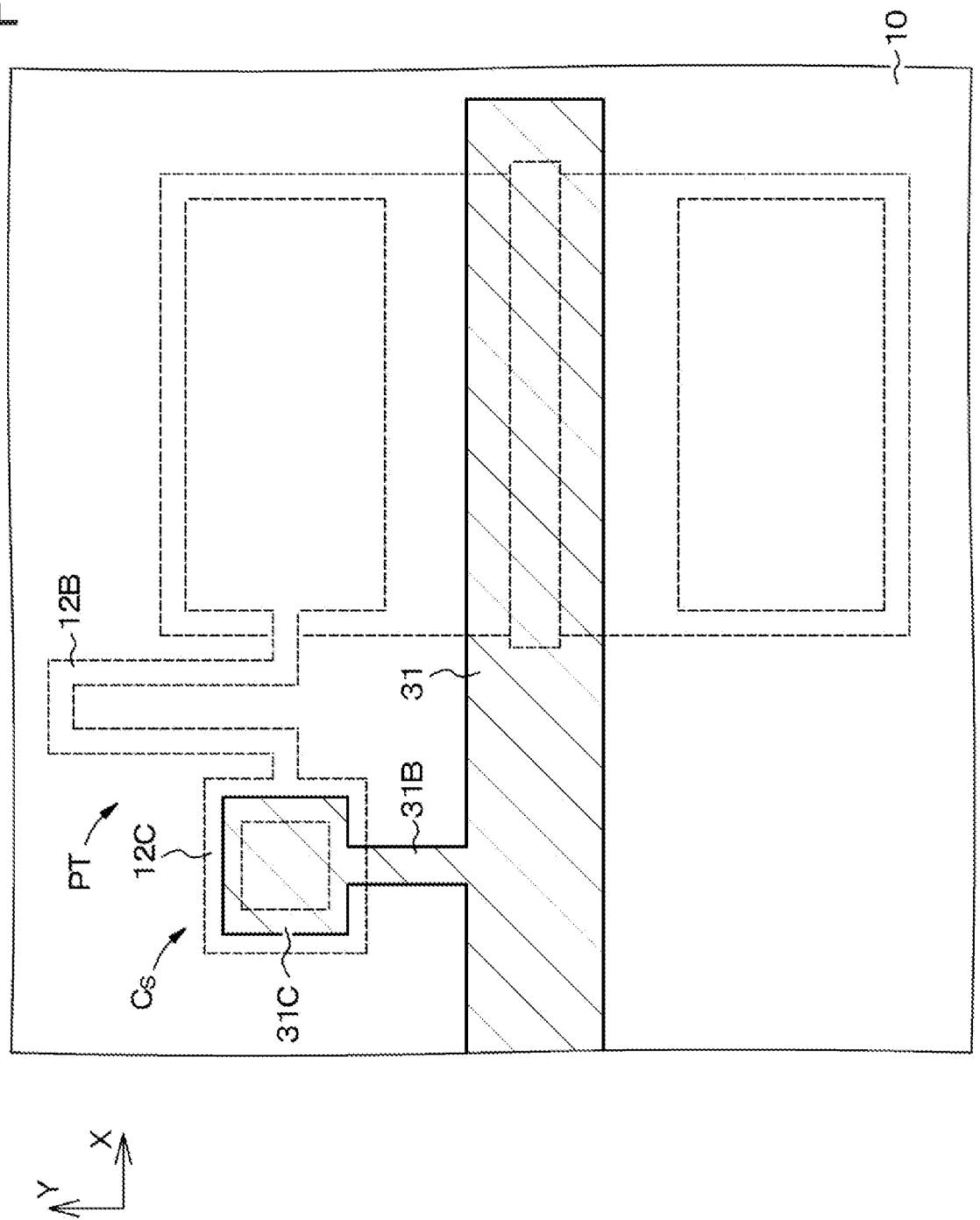
FIG. 6 is a schematic partial plan view for illustrating the manufacturing method of the semiconductor device according to the first embodiment of the present disclosure, continued from FIG. 5.
Figure 7:
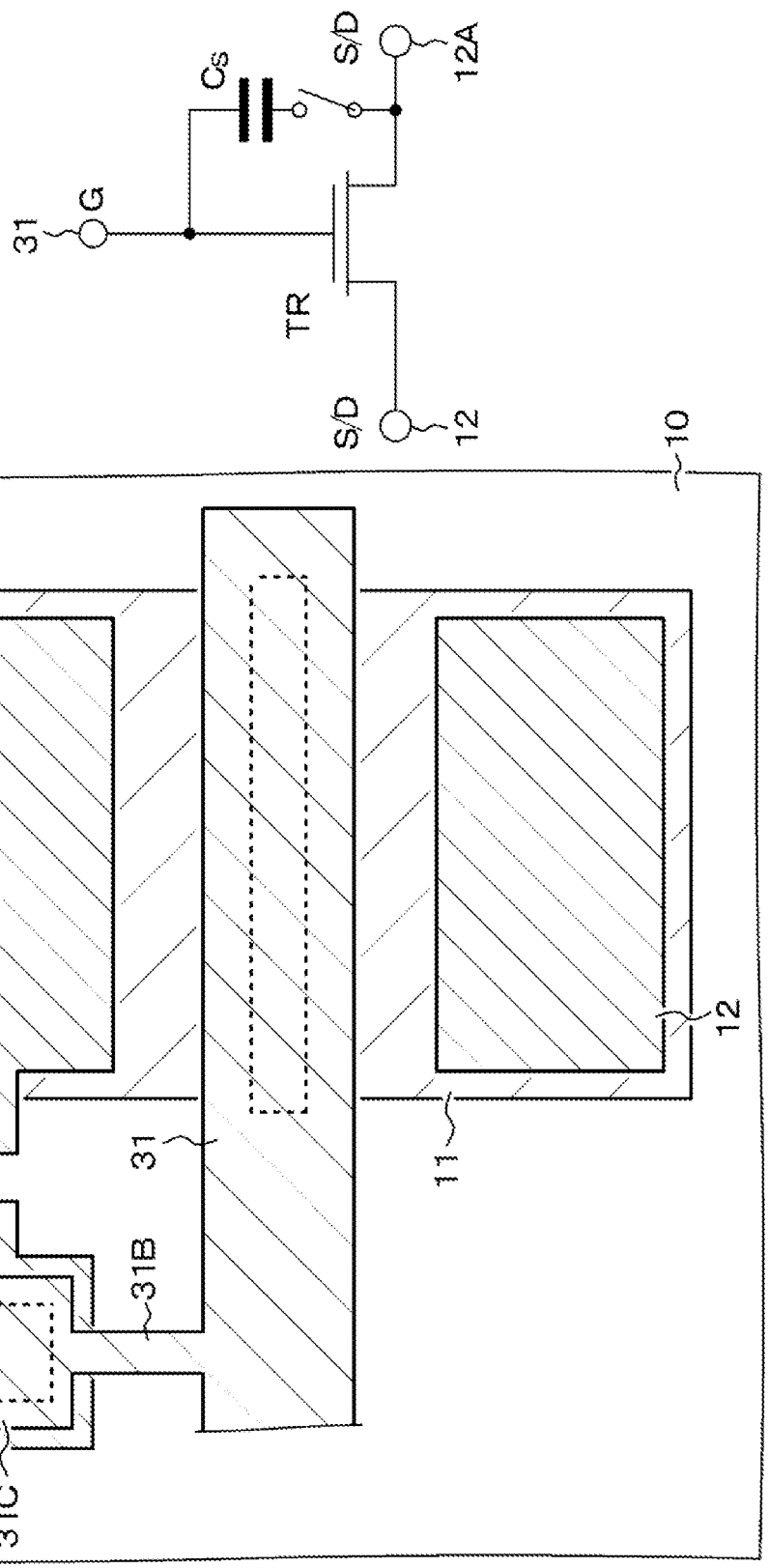
FIG. 7 is a schematic partial plan view for illustrating the manufacturing method of the semiconductor device according to the first embodiment of the present disclosure, continued from FIG. 6.

Step—130 (see FIG. 6)

Next, the insulating film 22, which constitutes the gate insulating film 22A and the like, is formed on the entire surface. Thereafter, the gate electrode 31, the intermediate wiring 31B, and the other electrode 31C forming the capacitor $C_s$ are formed at predetermined positions. A conductive material layer made of a metal material is formed on the entire surface. Next, the gate electrode 31, the intermediate wiring 31B, and the other electrode 31C forming the capacitor $C_s$ are formed at predetermined positions by using a known patterning method. The insulating planarization film 32 is formed on the entire surface including the gate electrode 31.

The semiconductor device 1 can be manufactured by the above-described process.

Note that there may further be performing a process of electrically interrupting the connection path after a final plasma process in the semiconductor manufacturing process ends. As described above, the portion indicated by reference character 40 in the FIG. 7 indicates the portion on which the interruption process has been performed.

Second Embodiment

A second embodiment also relates to a semiconductor device and a manufacturing method of the semiconductor device and electronic equipment according to the present disclosure.

Figure 8:
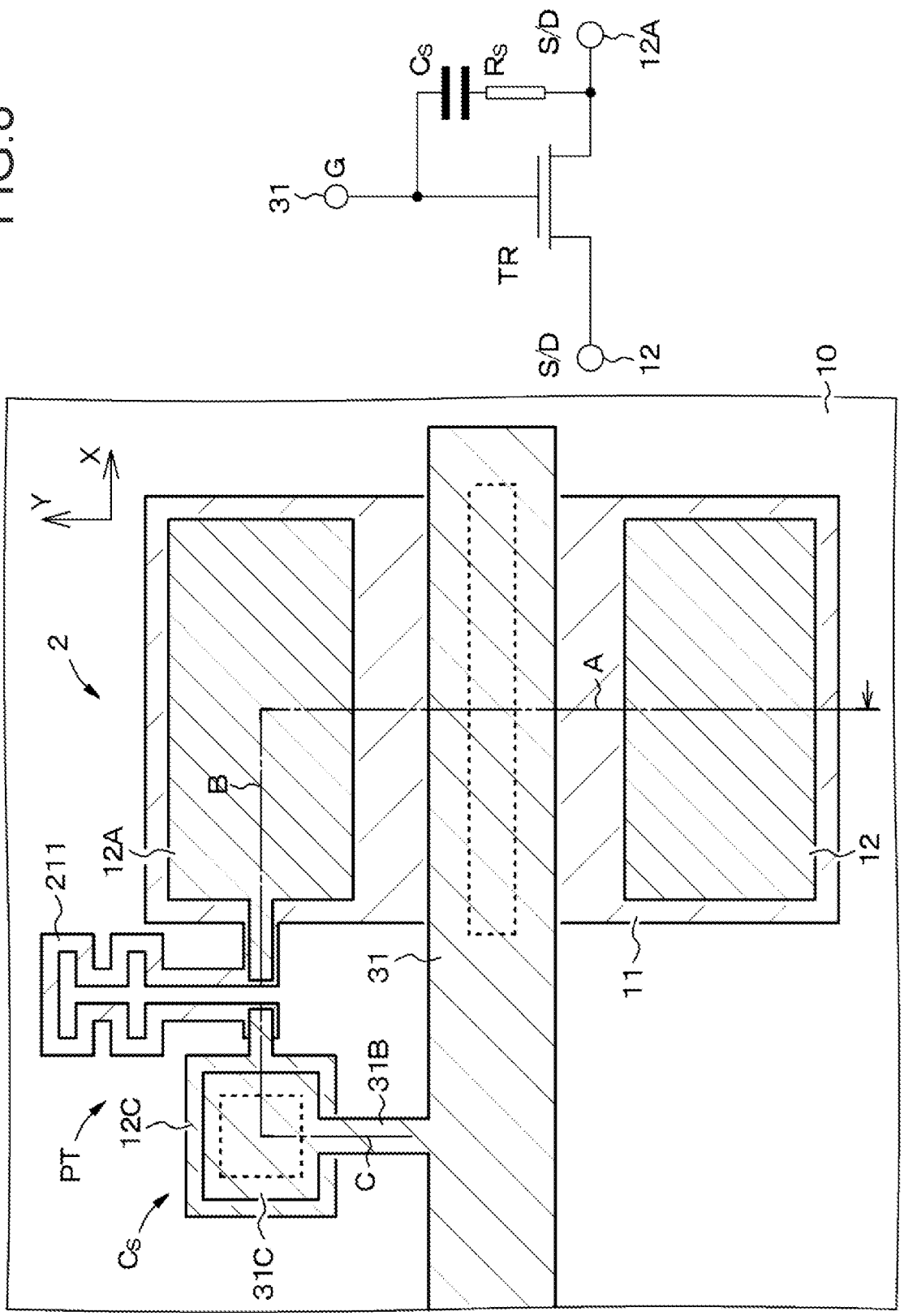
FIG. 8 is a schematic partial plan view for illustrating a configuration of a semiconductor device according to a second embodiment of the present disclosure.

FIG. 8 is a schematic partial plan view for illustrating a configuration of a semiconductor device according to the second embodiment of the present disclosure.

In a semiconductor device 2 according to the second embodiment, a connection path PT passing through a capacitor $C_s$ and a resistive element 211 connected in series to the capacitor $C_s$ is formed between at least one of pair of source/drain electrodes 12 and 12A (in the example illustrated in the figure, the source/drain electrode 12A) and a gate electrode 31. The resistive element 211 is formed in the same layer as a semiconductor material layer 11 forming a channel layer.

Figure 9:
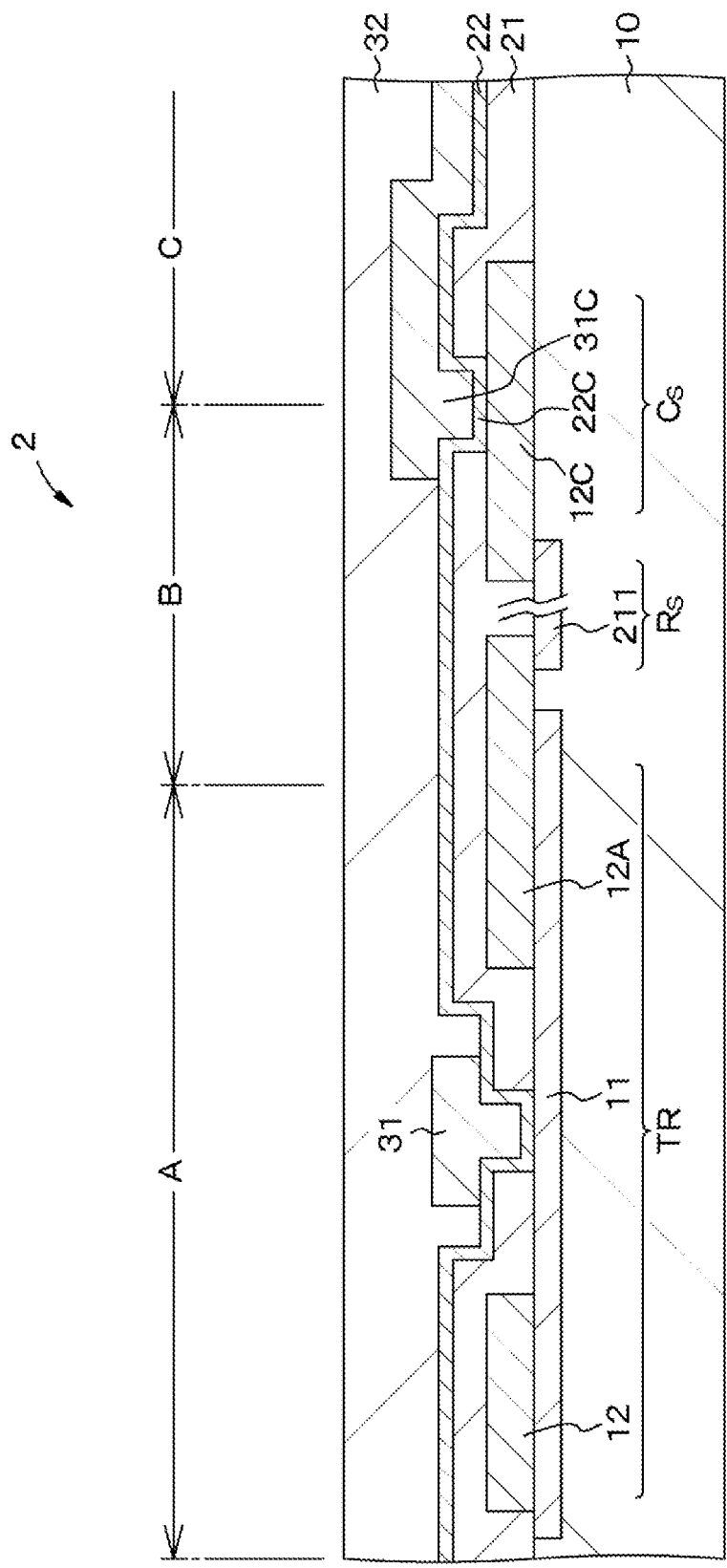
FIG. 9 is a schematic partial sectional view for illustrating the configuration of the semiconductor device according to the second embodiment of the present disclosure.

FIG. 9 is a schematic partial sectional view for illustrating the configuration of the semiconductor device according to the second embodiment of the present disclosure. More specifically, portions with reference characters A, B, and C indicated by long dashed short dashed lines in FIG. 8 are schematically illustrated in cross section. Note that, for convenience of illustration, the dimensions of components in FIG. 9 may be different from the dimensions illustrated in FIG. 8. Note that the plan shapes of elements are described with reference to FIGS. 10 and 11 for illustrating a manufacturing method of the semiconductor device as appropriate.

The semiconductor device 2 has a configuration in which the intermediate wiring 12B in the semiconductor device 1 illustrated in FIG. 1 is removed and replaced by the resistive element 211 formed in the same layer as the semiconductor material layer 11 forming the channel layer. If the resistive element 211 is sufficiently higher than the input impedance of the semiconductor device 2, even when a leakage of the capacitor $C_s$ occurs, degradation in characteristics such as gain decrease can be reduced to a practically negligible level.

The resistance value of the resistive element 211 can be set to a desired value by appropriately setting the width and length of the semiconductor material layer. Note that, in some cases, a process of performing ion implantation into the semiconductor material layer to increase the resistance may be performed.

Next, a manufacturing method of the semiconductor device 2 will be described.

Figure 10:
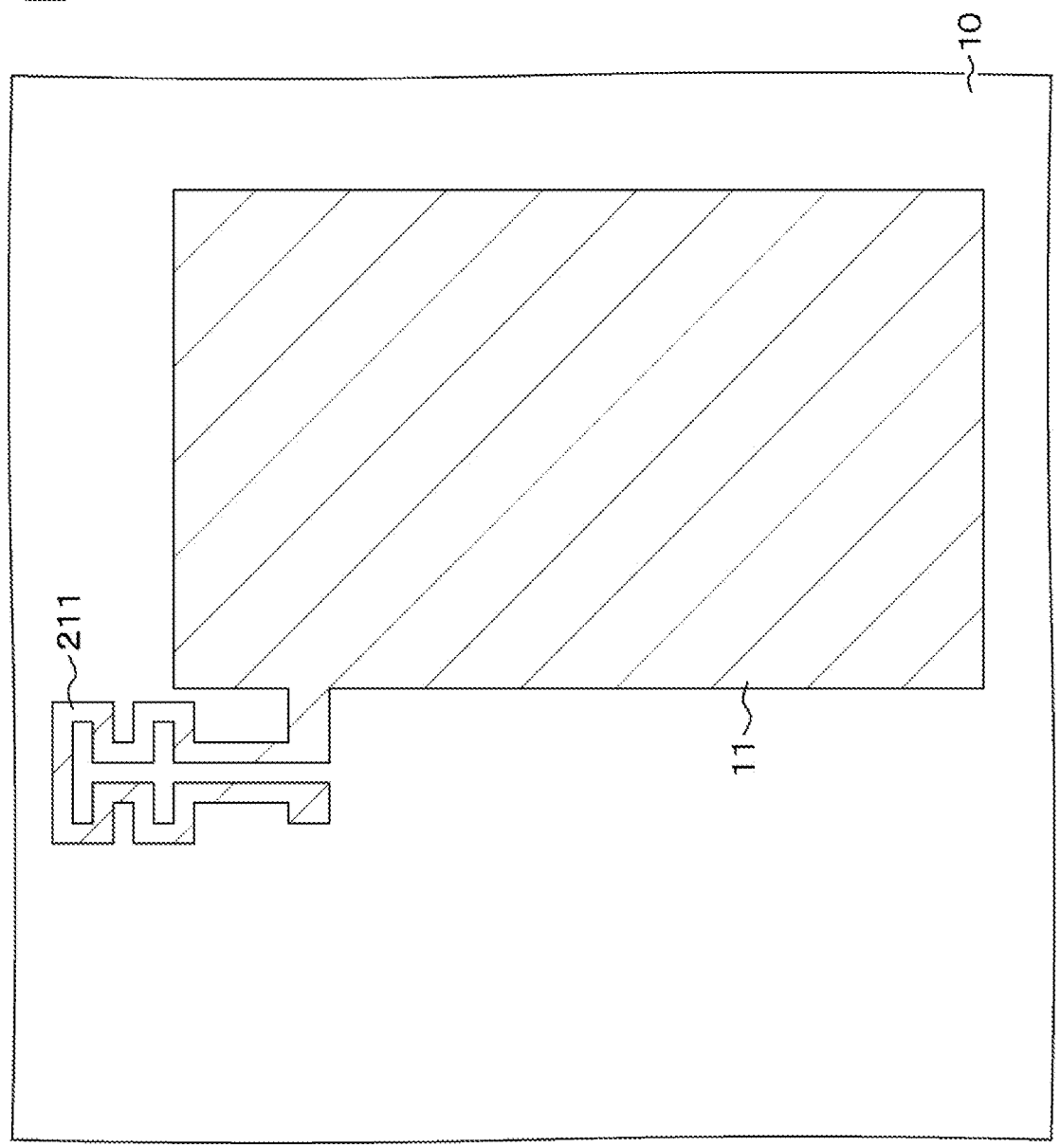
FIG. 10 is a schematic partial plan view for illustrating a manufacturing method of the semiconductor device according to the second embodiment of the present disclosure.
Figure 11:
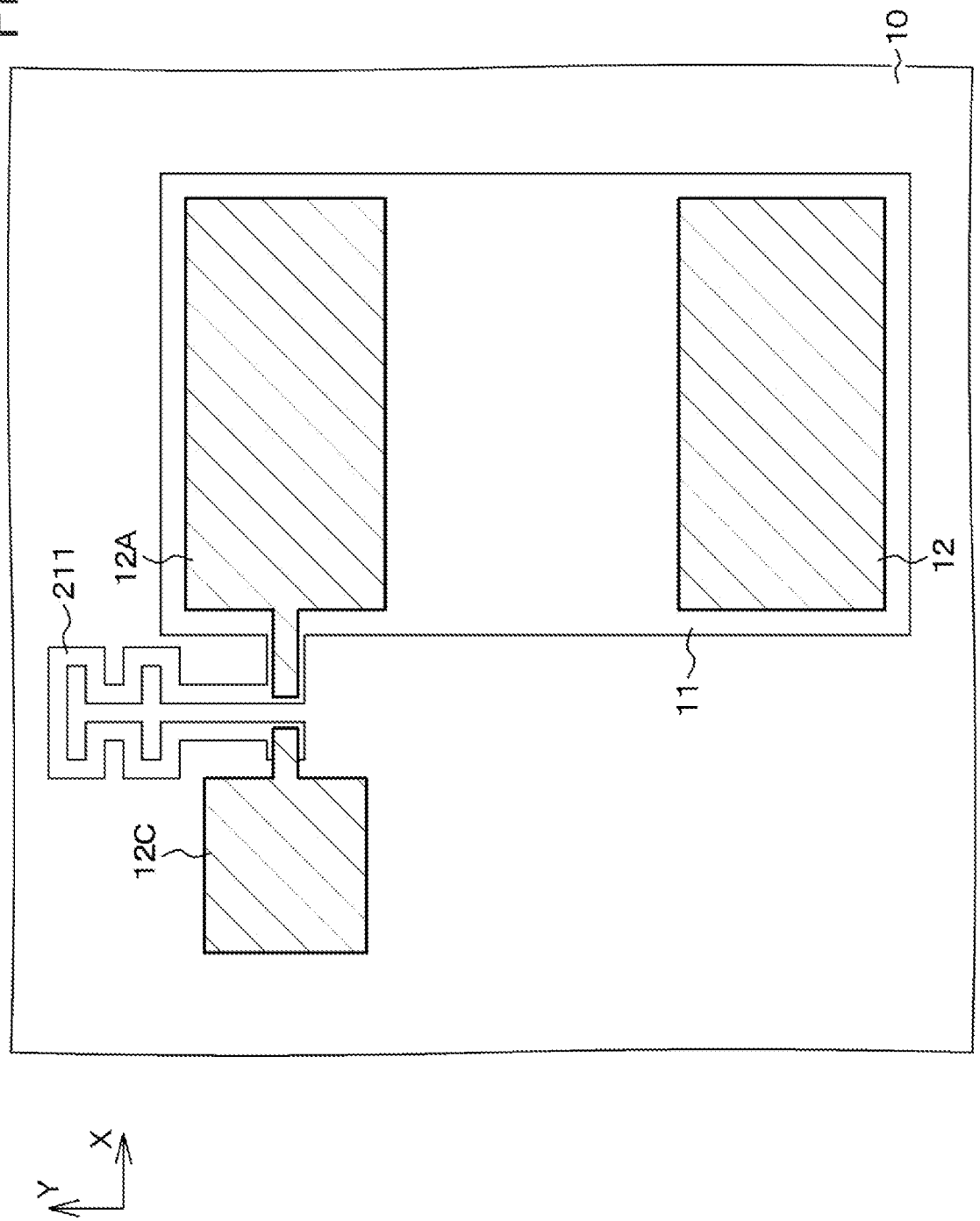
FIG. 11 is a schematic partial plan view for illustrating the manufacturing method of the semiconductor device according to the second embodiment of the present disclosure, continued from FIG. 10.

FIGS. 10 and 11 are schematic partial plan views for illustrating a manufacturing method of the semiconductor device according to the second embodiment of the present disclosure. Note that, from the viewpoint of legibility, insulating layers and insulating films are not illustrated in the plan views in principle.

Step—200 (see FIG. 10)

First, the semiconductor material layer 11 forming the channel layer is formed on the substrate 10. Specifically, the substrate 10 is prepared, and the semiconductor material layer 11 is formed thereon by known film formation and patterning methods. In addition, the resistive element 211 is formed by appropriately patterning a semiconductor material layer in the same layer as the semiconductor material layer 11.

Step—210 (see FIG. 11)

Next, the source/drain electrodes 12 and 12A and one electrode 12C forming the capacitor $C_s$ are formed. A conductive material layer made of a metal material is formed on the entire surface including the semiconductor material layer 11. Thereafter, the source/drain electrodes 12 and 12A and the one electrode 12C forming the capacitor $C_s$ are formed at predetermined positions by a patterning method.

Step—220

Next, the semiconductor device 2 can be manufactured by performing steps similar to [Step—120] and [Step—130] described in the first embodiment.

Third Embodiment

A third embodiment also relates to a semiconductor device and a manufacturing method of the semiconductor device and electronic equipment according to the present disclosure.

Figure 12:
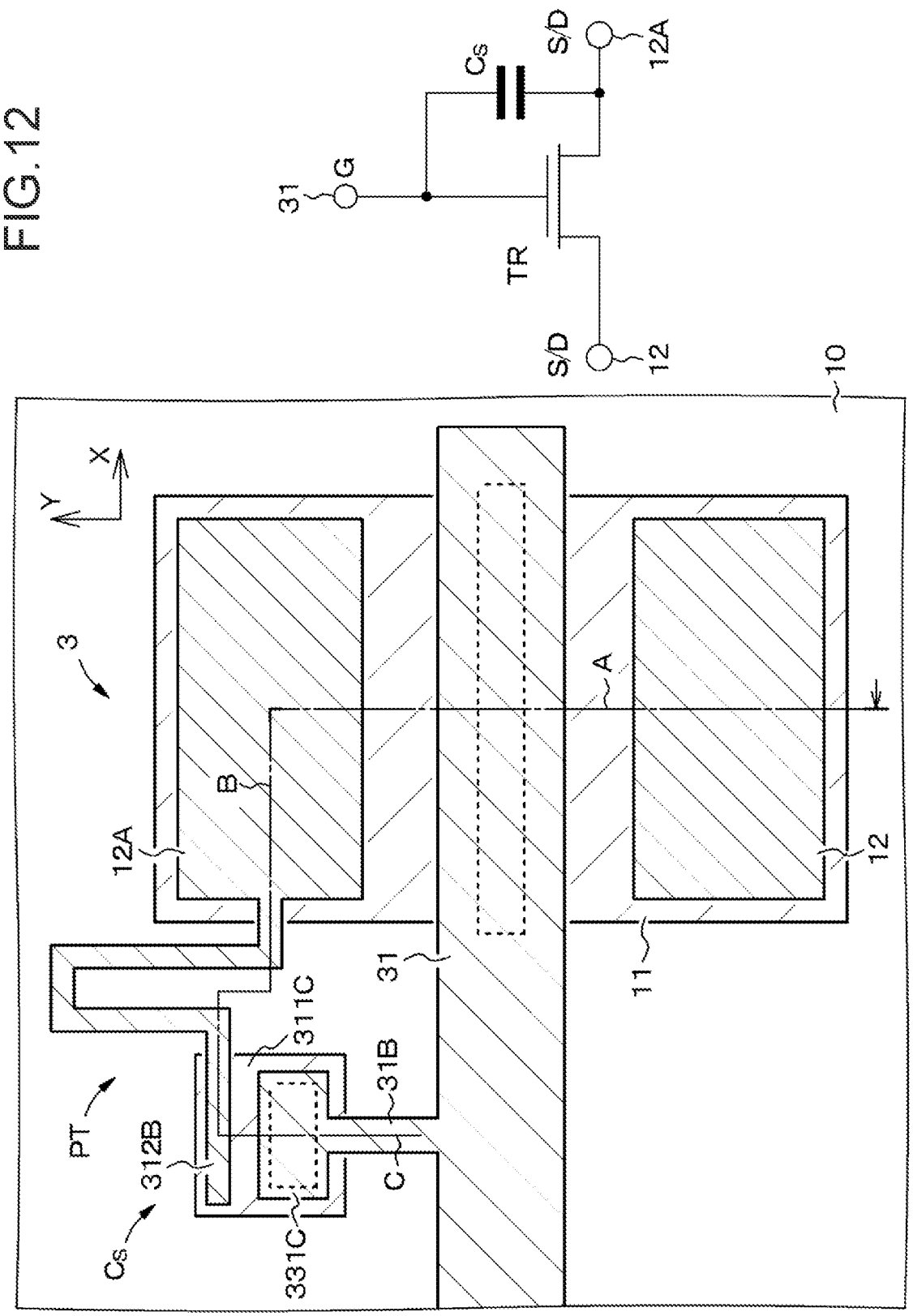
FIG. 12 is a schematic partial plan view for illustrating a configuration of a semiconductor device according to a third embodiment of the present disclosure.

FIG. 12 is a schematic partial plan view for illustrating a configuration of a semiconductor device according to the third embodiment of the present disclosure. Note that the plan shapes of elements are described with reference to FIGS. 14 to 17 for illustrating a manufacturing method of the semiconductor device as appropriate.

In the first and second embodiments, one of the pair of electrodes forming the capacitor is formed by using a conductive material layer formed in the same layer as the conductive material layer constituting the source/drain electrodes, and has formed thereon the insulating film forming the capacitor.

In contrast, in a semiconductor device 3 according to the third embodiment, one of the pair of electrodes forming the capacitor is composed of a semiconductor material electrode 311C formed in the same layer as a semiconductor material layer 11 forming the channel layer, and has formed thereon the insulating film forming the capacitor. The hatched portions in FIG. 14 indicate the plan shapes of the semiconductor material layer 11 and the semiconductor material electrode 311C.

Figure 13:
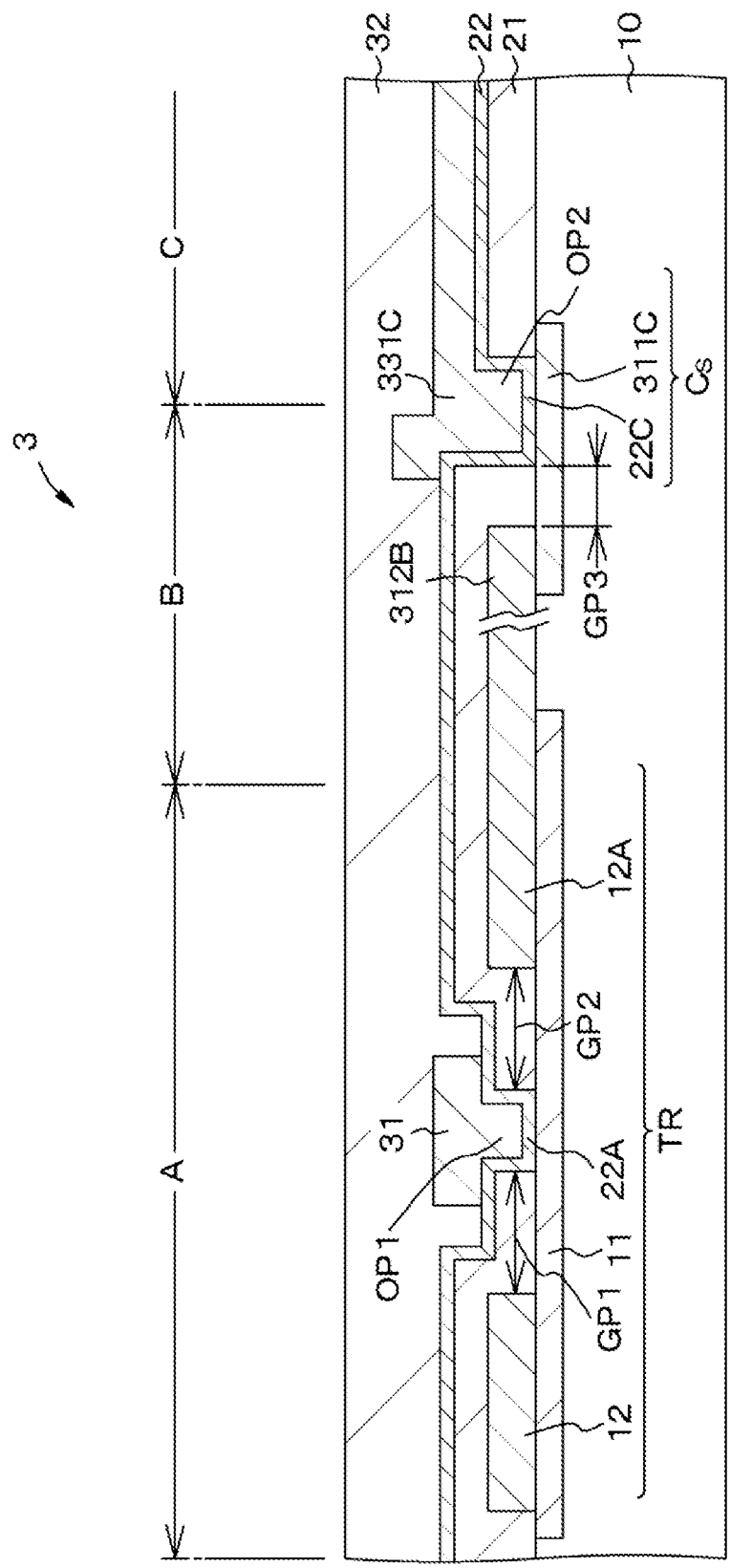
FIG. 13 is a schematic partial sectional view for illustrating the configuration of the semiconductor device according to the third embodiment of the present disclosure.

FIG. 13 is a schematic partial sectional view for illustrating the configuration of the semiconductor device according to the second embodiment of the present disclosure. More specifically, portions with reference characters A, B, and C indicated by long dashed short dashed lines in FIG. 12 are schematically illustrated in cross section. Note that, for convenience of illustration, the dimensions of components in FIG. 13 may be different from the dimensions illustrated in FIG. 12.

As illustrated in FIGS. 12 and 13, one end of the semiconductor material electrode 311C is connected to at least one of pair of source/drain electrodes 12 and 12A (in the example illustrated in the figure, the source/drain electrode 12A) via an intermediate wiring 312B formed in the same layer as the conductive material layer constituting the source/drain electrodes 12 and 12A. The hatched portions in FIG. 15 indicate the plan shapes of the pair of source/drain electrodes 12 and 12A and the intermediate wiring 312B.

An electrode 331C, which is the other of the pair of electrodes forming a capacitor $C_s$, is formed by using a conductive material layer formed in the same layer as the conductive material layer constituting a gate electrode 31. A width GP3 between an end portion of the intermediate wiring 312B and an end portion of the other electrode 331C of the capacitor $C_s$ is set to be narrower than a width between an end portion of the source/drain electrodes 12 and 12A and an end portion of the gate electrode 31 (represented by reference characters GP1 and GP2).

Unlike the first and second embodiments, the insulating film 22C used for the capacitor $C_s$ is formed on the semiconductor material electrode 311C. Therefore, decrease in the dielectric breakdown voltage due to variation in the roughness of the underlying layer does not occur. However, since the width GP3 between the end portion of the intermediate wiring 12B and the end portion of the other electrode 331C of the capacitor $C_s$ is short, the distance of a depletion layer formed in the semiconductor material electrode 311C becomes short, and thus, an electric field applied to the insulating film 22C has a higher intensity than an electric field applied to a gate insulating film 22A, and the dielectric breakdown voltage is reduced. Thus, it is possible to obtain an effect similar to that of the first embodiment and the like.

Next, a manufacturing method of the semiconductor device 3 will be described.

FIGS. 14 to 17 are schematic partial plan views for illustrating a manufacturing method of the semiconductor device according to the third embodiment of the present disclosure. Note that, from the viewpoint of legibility, insulating layers and insulating films are not illustrated in the plan views in principle.

Figure 14:
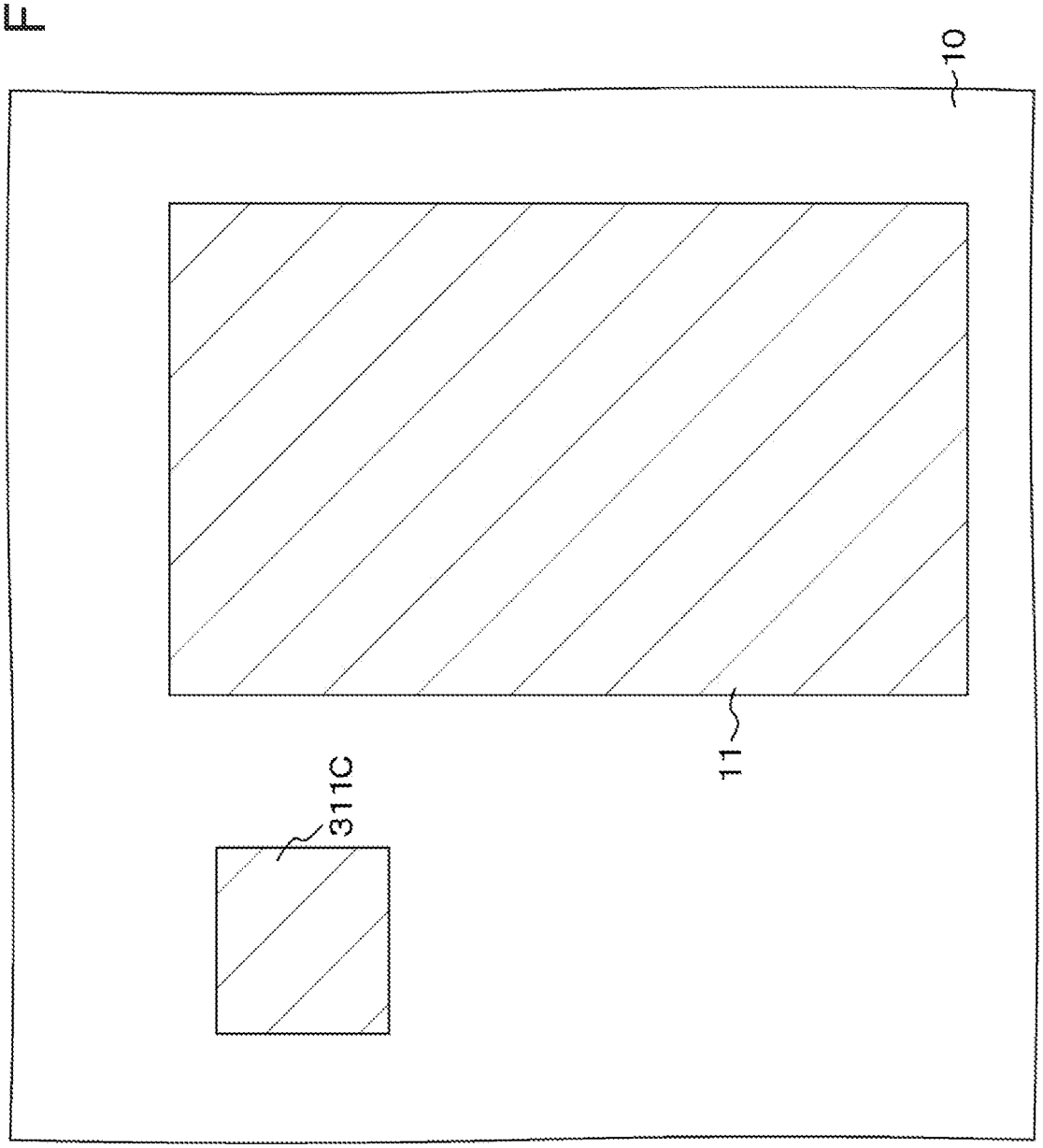
FIG. 14 is a schematic partial plan view for illustrating a manufacturing method of the semiconductor device according to the third embodiment of the present disclosure.

Step—300 (see FIG. 14)

First, the semiconductor material layer 11 forming the channel layer is formed on the substrate 10. Specifically, the substrate 10 is prepared, and the semiconductor material layer 11 is formed thereon by known film formation and patterning methods. In addition, the semiconductor material electrode 311C is formed by appropriately patterning a semiconductor material layer in the same layer as the semiconductor material layer 11.

Figure 15:
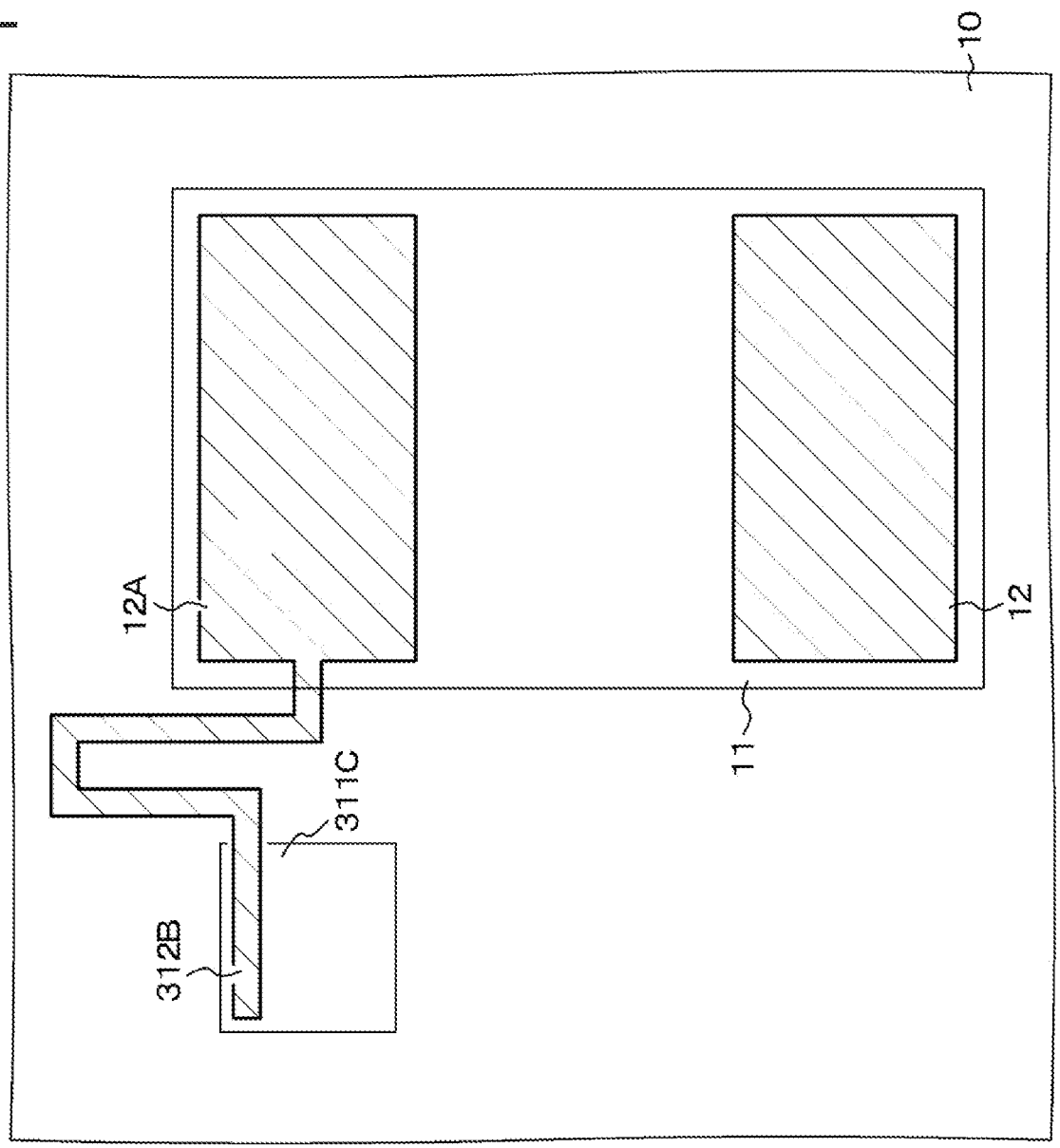
FIG. 15 is a schematic partial plan view for illustrating the manufacturing method of the semiconductor device according to the third embodiment of the present disclosure, continued from FIG. 14.

Step—310 (see FIG. 15)

Next, the source/drain electrodes 12 and 12A and the intermediate wiring 312B are formed. A conductive material layer made of a metal material is formed on the entire surface including the semiconductor material layer 11. Thereafter, the source/drain electrodes 12 and 12A and the intermediate wiring 312B can be formed at predetermined positions by a patterning method.

Figure 16:
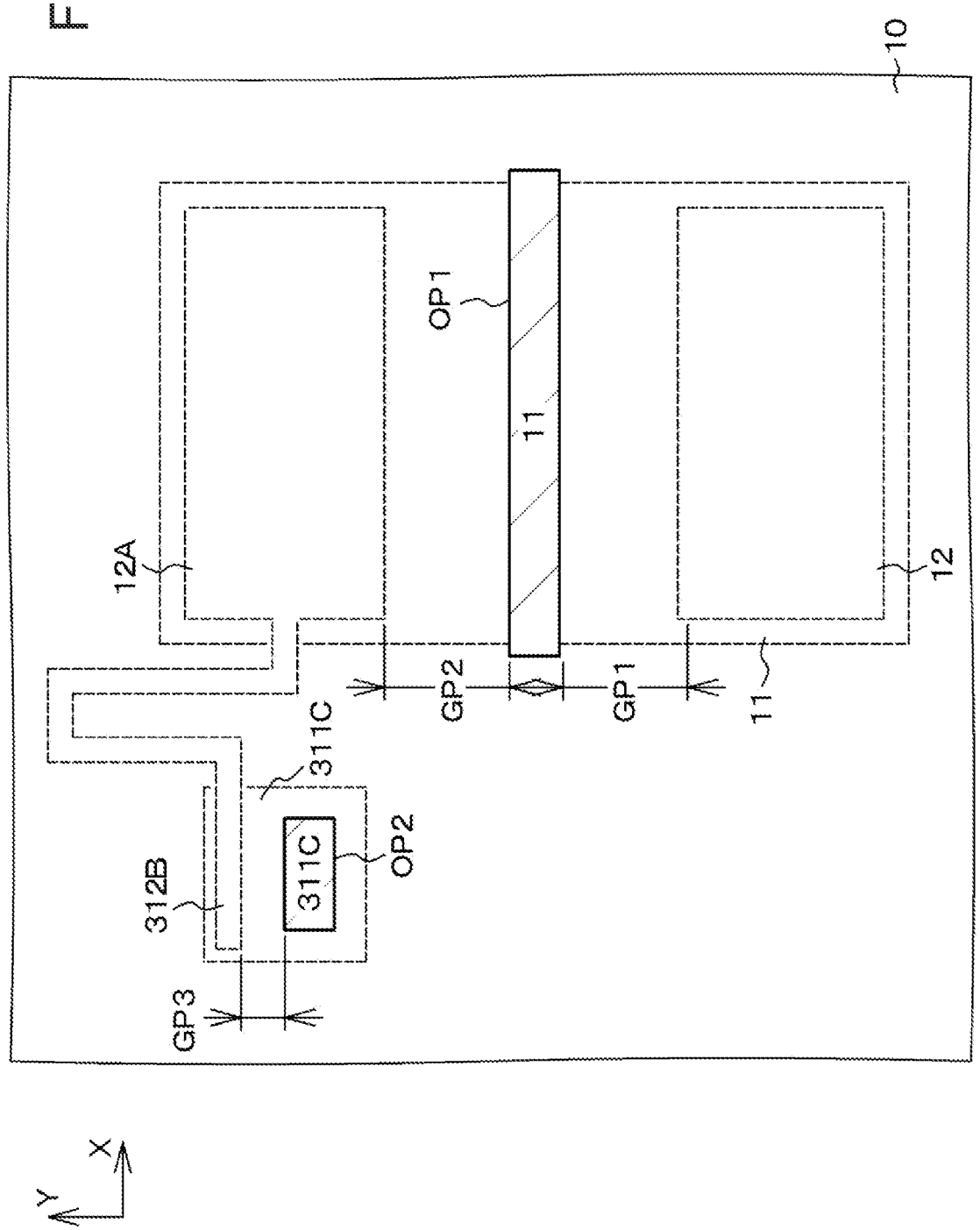
FIG. 16 is a schematic partial plan view for illustrating the manufacturing method of the semiconductor device according to the third embodiment of the present disclosure, continued from FIG. 15.

Step—320 (see FIG. 16)

Next, the interlayer insulating layer 21 is formed on the entire surface. Thereafter, the opening OP1, from which the portion of the semiconductor material layer 11 positioned below the gate electrode 31 is exposed, and the opening OP2, from which a part of the one electrode 311C of the capacitor $C_s$ is exposed, are provided.

Figure 17:
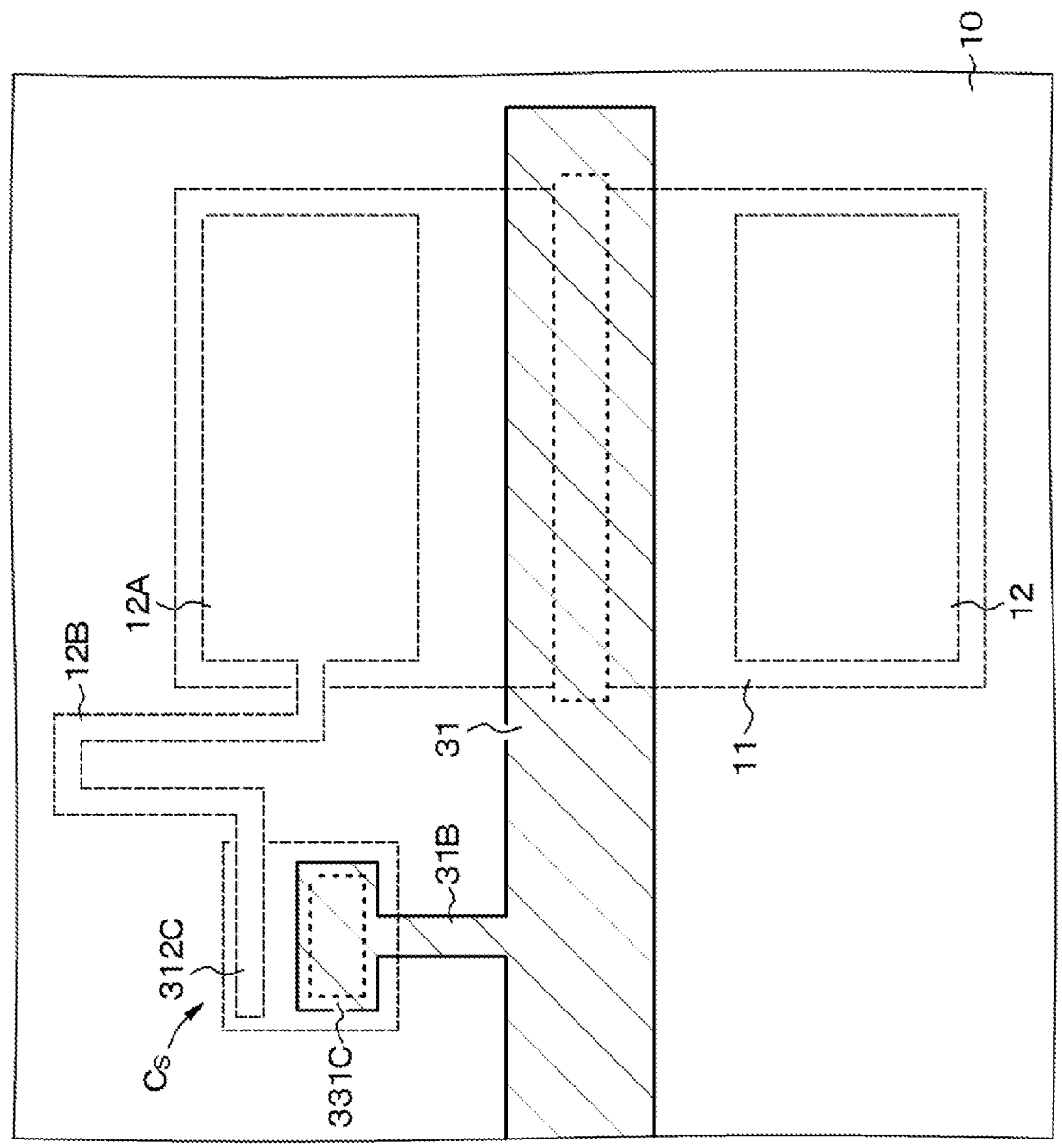
FIG. 17 is a schematic partial plan view for illustrating the manufacturing method of the semiconductor device according to the third embodiment of the present disclosure, continued from FIG. 16.

Step—330 (see FIG. 17)

Next, the insulating film 22, which constitutes the gate insulating film 22A and the like, is formed on the entire surface. Thereafter, the gate electrode 31, the intermediate wiring 31B, and the other electrode 331C forming the capacitor $C_s$ are formed at predetermined positions. A conductive material layer made of a metal material is formed on the entire surface. Next, the gate electrode 31, the intermediate wiring 31B, and the other electrode 31C forming the capacitor $C_s$ can be formed at predetermined positions by using a known patterning method. The insulating planarization film 32 is formed on the entire surface including the gate electrode 31.

The semiconductor device 3 can be manufactured by the above-described process.

In the semiconductor device according to the present disclosure described above, it is possible to form a capacitor with a low withstand voltage by using an insulating film formed in the same layer as a gate insulating film without partial thinning. Therefore, there is no need to form a mask or the like required for partial thinning, and damage to the gate insulating film due to partial thinning does not occur. Also, it is possible to suppress breakdown and degradation of the gate insulating film due to PID during the semiconductor device manufacturing process. In addition, since protection from the time of formation of the gate electrode is enabled, the device can be protected from all plasma processes.

DESCRIPTION OF ELECTRONIC EQUIPMENT

The semiconductor device of the present disclosure can be used for electronic equipment constituting a wireless communication device or the like in a mobile communication system or the like, for example. In particular, it is preferable for use as an RF switch or a power amplifier. That is, by using the semiconductor device of the present disclosure, which is excellent in high frequency characteristics and high efficiency characteristics, as an RF switch or a power amplifier, it is possible to achieve wireless communication with high speed, high efficiency, and low power consumption. In particular, for a mobile communication terminal, the high speed, high efficiency, and low power consumption can extend the life, which can improve convenience.

Figure 18:
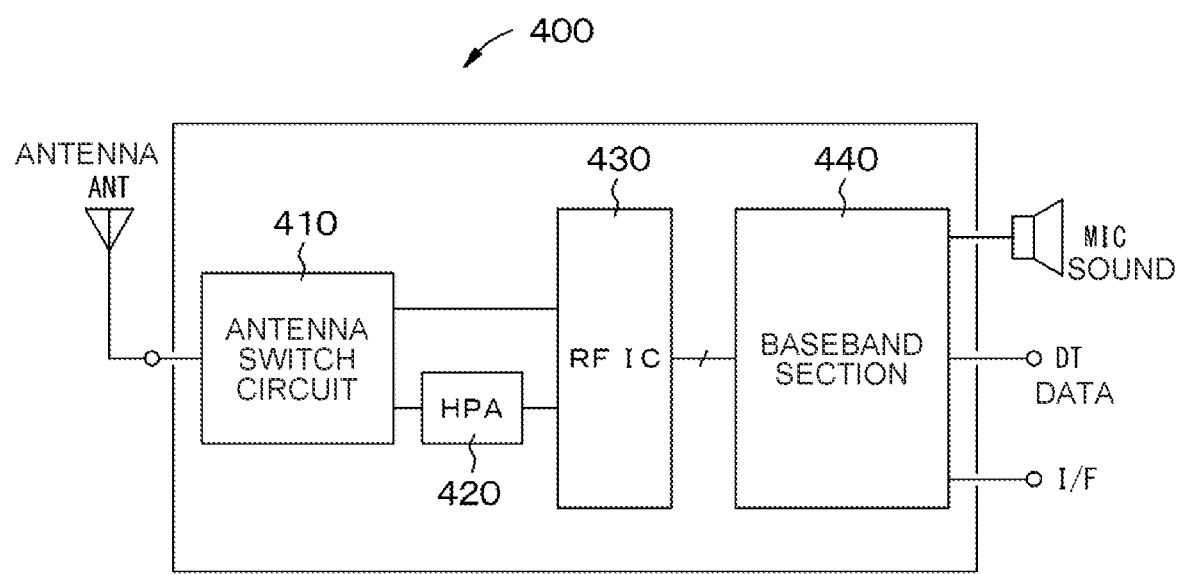
FIG. 18 is a schematic configuration diagram for illustrating a configuration of a wireless communication device using the semiconductor device according to the present disclosure.

FIG. 18 represents an example of electronic equipment constituting a wireless communication device. Electronic equipment 400 is a mobile phone system having multiple functions such as sound, data communication, and LAN connection. The electronic equipment 400 includes, for example, an antenna ANT, an antenna switch circuit 410, a high power amplifier (HPA) 420, a radio frequency integrated circuit RFIC 430, a baseband section 440, a sound output section MIC, a data output section DT, and an interface section I/F (e.g., wireless LAN (W-LAN; Wireless Local Area Network), Bluetooth (registered trademark), etc.). The radio frequency integrated circuit RFIC 430 and the baseband section 440 are connected by the interface section I/F.

In this electronic equipment 400, at the time of transmission, that is, when a transmission signal is output from a transmission system of the electronic equipment 400 to the antenna ANT, a transmission signal output from the baseband section 440 is output to the antenna ANT via the radio frequency integrated circuit RFIC 430, the high power amplifier (HPA) 420, and the antenna switch circuit 410.

In addition, at the time of reception, that is, when a signal received at the antenna ANT is input to a reception system of the electronic equipment 400, the received signal is input to the baseband section 440 via the antenna switch circuit 410 and the radio frequency integrated circuit RFIC 430. A signal processed at the baseband section 440 is output from output sections such as the sound output section MIC, the data output section DT, and the interface section I/F.

Application Examples

The technique according to the present disclosure can be applied to various products. For example, the technique according to the present disclosure may be realized as a device provided on a movable body of any kind, such as a motor vehicle, an electric vehicle, a hybrid electric vehicle, a two-wheeled motor vehicle, a bicycle, a personal mobility vehicle, an airplane, a drone, a ship, a robot, a construction machine, or an agricultural machine (tractor).

Figure 19:
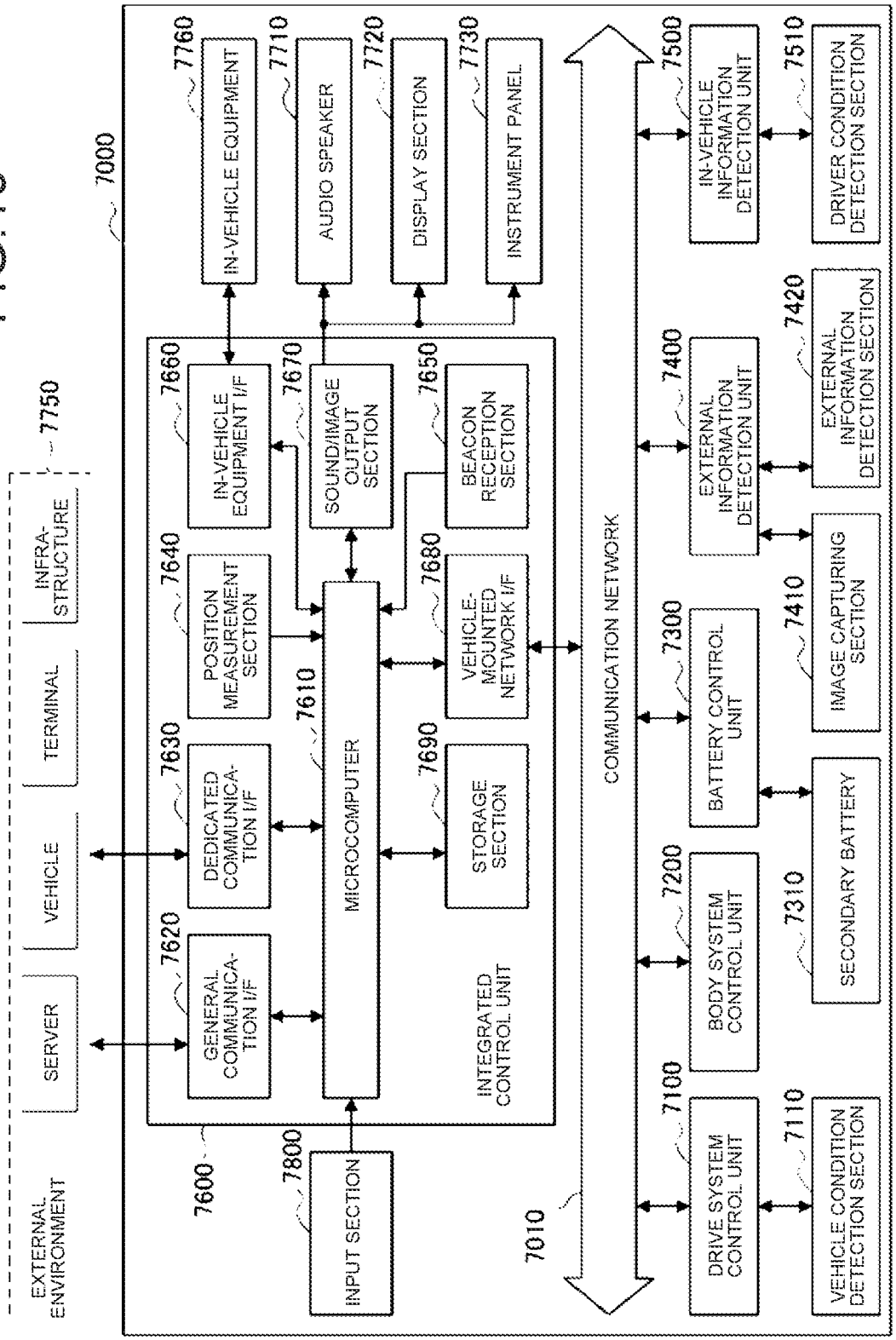
FIG. 19 is a block diagram illustrating an example of a schematic configuration of a vehicle control system.

FIG. 19 is a block diagram illustrating a schematic configuration example of a vehicle control system 7000 as an example of a control system of a movable body to which the technique according to the present disclosure can be applied. The vehicle control system 7000 includes a plurality of electronic control units connected via a communication network 7010. In the example illustrated in FIG. 19, the vehicle control system 7000 includes a drive system control unit 7100, a body system control unit 7200, a battery control unit 7300, an external information detection unit 7400, an in-vehicle information detection unit 7500, and an integrated control unit 7600. The communication network 7010 connecting the plurality of control units may be, for example, a vehicle-mounted communication network compliant with any standard such as a controller area network (CAN), a local interconnect network (LIN), a local area network (LAN), or FlexRay (registered trademark).

Each control unit includes a microcomputer that performs computational processing according to various programs, a storage section that stores programs executed by the microcomputer and parameters and the like used for various computations, and a drive circuit that drives various control target devices. Each control unit includes a network I/F for performing communication with another control unit via the communication network 7010, and includes a communication I/F for performing wired or wireless communication with a device, sensor, or the like internal or external to the vehicle. In FIG. 19, a microcomputer 7610, a general communication I/F 7620, a dedicated communication I/F 7630, a position measurement section 7640, a beacon reception section 7650, an in-vehicle equipment I/F 7660, a sound/image output section 7670, a vehicle-mounted network I/F 7680, and a storage section 7690 are illustrated as functional components of the integrated control unit 7600. The other control units also include a microcomputer, communication I/Fs, a storage section, and the like.

The drive system control unit 7100 controls the operation of devices related to the drive system of the vehicle according to various programs. For example, the drive system control unit 7100 functions as a control device for a driving force generation device for generating driving force for the vehicle such as an internal combustion engine or driving motor, a driving force transmission mechanism for transmitting the driving force to wheels, a steering mechanism for adjusting the steering angle of the vehicle, a braking device for generating braking force for the vehicle, and the like. The drive system control unit 7100 may have a function as a control device for an antilock brake system (ABS), an electronic stability control (ESC), or the like.

A vehicle condition detection section 7110 is connected to the drive system control unit 7100. The vehicle condition detection section 7110 includes, for example, at least one of a gyroscope sensor for detecting an angular velocity of axial rotational motion of the vehicle body, an acceleration sensor for detecting an acceleration of the vehicle, or a sensor for detecting an operation amount of an accelerator pedal, an operation amount of a brake pedal, a steering angle of a steering wheel, an engine rotational rate, or a rotation speed of wheels. The drive system control unit 7100 performs computational processing by using signals input from the vehicle condition detection section 7110 to control the internal combustion engine, the driving motor, an electric power steering device, a brake device, and the like.

The body system control unit 7200 controls the operation of various devices provided to the vehicle body according to various programs. For example, the body system control unit 7200 functions as a control device for a keyless entry system, a smart key system, a power window device, or various lamps such as a head lamp, a back lamp, a brake lamp, a turn signal, or a fog lamp. In this case, radio waves emitted from a mobile terminal that replaces a key or signals from various switches are input to the body system control unit 7200. The body system control unit 7200 receives the input of these radio waves or signals to control a door locking device, the power window device, lamps, or the like of the vehicle.

The battery control unit 7300 controls a secondary battery 7310 that is a source of power supply for the driving motor according to various programs. For example, information such as a battery temperature, a battery output voltage, or a battery remaining capacity is input from a battery device including the secondary battery 7310 to the battery control unit 7300. The battery control unit 7300 performs computational processing by using these signals, and performs temperature adjustment control for the secondary battery 7310 or control for a cooling device provided in the battery device or the like.

The external information detection unit 7400 detects information external to the vehicle to which the vehicle control system 7000 is provided. For example, at least one of an image capturing section 7410 and an external information detection section 7420 is connected to the external information detection unit 7400. The image capturing section 7410 includes at least one of a Time of Flight (ToF) camera, a stereo camera, a monocular camera, an infrared camera, and another camera. The external information detection section 7420 includes, for example, at least one of an environment sensor for detecting current weather or meteorological conditions or an ambient information detection sensor for detecting another vehicle, obstacle, pedestrian, or the like around the vehicle to which the vehicle control system 7000 is provided.

The environment sensor may be, for example, at least one of a rain sensor for detecting rainy weather, a fog sensor for detecting fog, a sunshine sensor for detecting the degree of sunshine, and a snow sensor for detecting snow. The ambient information detection sensor may be at least one of an ultrasonic sensor, a radar device, and a Light Detection and Ranging, Laser Imaging Detection and Ranging (LIDAR) device. The image capturing section 7410 and the external information detection section 7420 may be provided as sensors or devices independent of each other, or may be provided as a device into which a plurality of sensors or devices are integrated.

Figure 20:
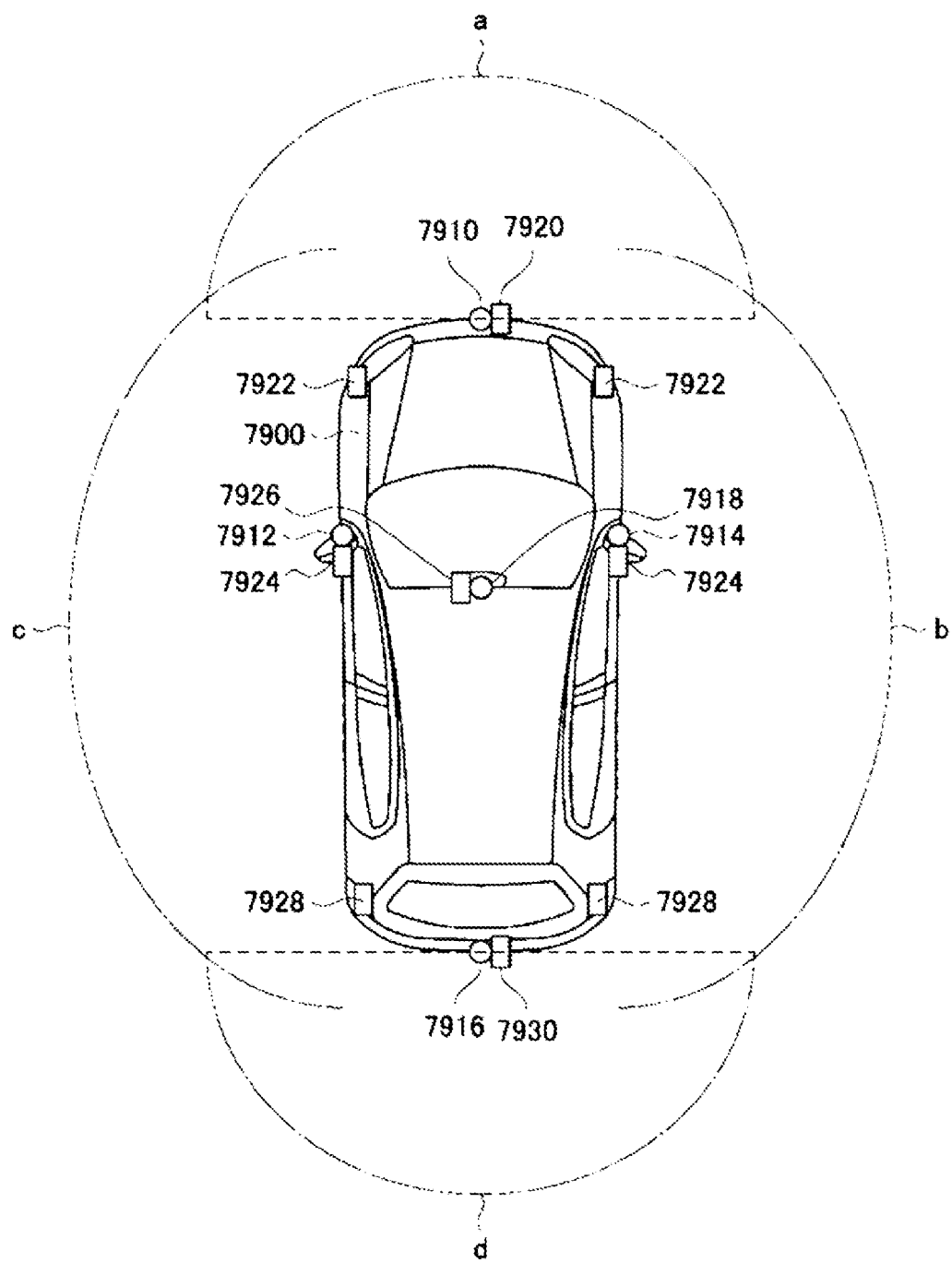
FIG. 20 is an illustrative diagram illustrating an example of installation positions of an external information detection section and an image capturing section.

Here, FIG. 20 illustrates an example of installation positions of the image capturing section 7410 and the external information detection section 7420. Image capturing sections 7910, 7912, 7914, 7916, and 7918 are provided at least one position of a front nose, a side mirror, a rear bumper, a back door, and an upper portion of a windshield inside the cabin of a vehicle 7900, for example. The image capturing section 7910 provided at the front nose and the image capturing section 7918 provided at the upper portion of the windshield inside the cabin mainly acquire images in a forward direction of the vehicle 7900. The image capturing sections 7912 and 7914 provided at side mirrors mainly acquire images in lateral directions of the vehicle 7900. The image capturing sections 7916 provided at the rear bumper or back door mainly acquires images in a rear direction of the vehicle 7900. The image capturing section 7918 provided at the upper portion of the windshield inside the cabin is mainly used for detecting a preceding vehicle or a pedestrian, an obstacle, a traffic signal, a traffic sign, a lane, or the like.

Note that an example of fields of view of the respective image capturing sections 7910, 7912, 7914, and 7916 is illustrated in FIG. 20. Field of view a indicates the field of view of the image capturing section 7910 provided at the front nose, fields of view b and c indicate the fields of view of the image capturing sections 7912 and 7914 respectively provided at the side mirrors, and field of view d indicates the field of view of the image capturing section 7916 provided at the rear bumper or back door. For example, image data captured by the image capturing sections 7910, 7912, 7914, and 7916 are superposed to obtain an overhead-view image in which the vehicle 7900 is seen from above.

External information detection sections 7920, 7922, 7924, 7926, 7928, and 7930 provided at the front, rear, sides, corners, and the upper portion of the windshield inside the cabin of the vehicle 7900 may be ultrasonic sensors or radar devices, for example. The external information detection sections 7920, 7926, and 7930 provided at the front nose, rear bumper, back door, and the upper portion of the windshield inside the cabin of the vehicle 7900 may be LIDAR devices, for example. These external information detection sections 7920 to 7930 are mainly used for detecting a preceding vehicle, a pedestrian, an obstacle, or the like.

The description will be continued with reference back to FIG. 19. The external information detection unit 7400 causes the image capturing section 7410 to capture an image external to the vehicle and receives captured image data. The external information detection unit 7400 also receives detection information from the external information detection section 7420 connected. If the external information detection section 7420 is an ultrasonic sensor, a radar device, or a LIDAR device, the external information detection unit 7400 causes ultrasound waves, electromagnetic waves, or the like to be emitted and receives information of received reflected waves. The external information detection unit 7400 may perform object detection processing or distance detection processing on a person, a vehicle, an obstacle, a sign, characters on the road surface, or the like based on the received information. The external information detection unit 7400 may perform environment recognition processing for recognize rain, fog, road surface conditions, or the like based on the received information. The external information detection unit 7400 may calculate the distance to an object external to the vehicle based on the received information.

The external information detection unit 7400 may also perform image recognition processing or distance detection processing for recognizing a person, a vehicle, an obstacle, a sign, characters on the road surface, or the like based on the received image data. The external information detection unit 7400 may perform processing such as distortion correction or alignment on the received image data and composite image data captured by the different image capturing sections 7410 to generate an overhead-view image or a panorama image. The external information detection unit 7400 may perform viewpoint conversion processing by using image data captured by the different image capturing sections 7410.

The in-vehicle information detection unit 7500 detects information inside the vehicle. For example, a driver condition detection section 7510 for detecting conditions of the driver is connected to the in-vehicle information detection unit 7500. The driver condition detection section 7510 may include a camera for capturing an image of the driver, a biological sensor for detecting biological information of the driver, a microphone for collecting sounds inside the cabin, and the like. For example, the biological sensor is provided on the surface of a seat, to the steering wheel, or the like, and detects biological information of an occupant sitting on the seat or the driver grasping the steering wheel. The in-vehicle information detection unit 7500 may calculate the degree of tiredness or the degree of concentration of the driver or determine whether the driver is dozing off based on detection information input from the driver condition detection section 7510. The in-vehicle information detection unit 7500 may perform processing such as noise cancelling processing on a collected sound signal.

The integrated control unit 7600 controls the overall operation in the vehicle control system 7000 according to various programs. An input section 7800 is connected to the integrated control unit 7600. For example, the input section 7800 is realized by a device on which an input operation may be performed by an occupant, such as a touch panel, a button, a microphone, a switch, a lever, or the like. Data obtained by performing sound recognition on a sound input by a microphone may be input to the integrated control unit 7600. For example, the input section 7800 may be a remote control device utilizing infrared radiation or other radio waves, or may be external connection equipment such as a mobile phone or a personal digital assistant (PDA) capable of operating the vehicle control system 7000. The input section 7800 may be a camera, for example, in which case an occupant can input information by a gesture. Alternatively, data obtained by detecting a motion of a wearable device worn by an occupant may be input. Further, the input section 7800 may include, for example, an input control circuit that generates an input signal based on information input by an occupant or the like by using the input section 7800 described above and outputs the input signal to the integrated control unit 7600, or the like. An occupant or the like operates the input section 7800 to input various data to or indicate processing operations to the vehicle control system 7000.

The storage section 7690 may include a read only memory (ROM) that stores various programs executed by the microcomputer and a random access memory (RAM) that stores various parameters, computation results, sensor values, or the like. In addition, the storage section 7690 may be realized by a magnetic storage device such as a hard disc drive (HDD), a semiconductor storage device, an optical storage device, a magneto-optical storage device, or the like.

The general communication I/F 7620 is a general-purpose communication I/F that interfaces communication with various pieces of equipment present in an external environment 7750. The general communication I/F 7620 may implement a cellular communication protocol such as Global System of Mobile communications (GSM) (registered trademark), WiMAX, Long Term Evolution (LTE), or LTE-Advanced (LTE-A) or another wireless communication protocol such as wireless LAN (also referred to as Wi-Fi (registered trademark)) or Bluetooth (registered trademark). For example, the general communication I/F 7620 may connect to equipment (e.g., an application server or a control server) present on an external network (e.g., the Internet, a cloud network, or a network specific to a business entity) via a base station or an access point. The general communication I/F 7620 may also connect to a terminal (e.g., a terminal of the driver, a pedestrian, or a store, or a Machine Type Communication (MTC) terminal) present near the vehicle by using the Peer To Peer (P2P) technology, for example.

The dedicated communication I/F 7630 is a communication I/F that supports communication protocols established for use in vehicles. For example, the dedicated communication I/F 7630 may implement Wireless Access in Vehicle Environment (WAVE) or Dedicated Short Range Communications (DSRC) combining IEEE802.11p for lower layers and IEEE1609 for upper layers, or a standard protocol such as a cellular communication protocol. The dedicated communication I/F 7630 carries out V2X communication, which is typically a concept including one or more of Vehicle to Vehicle communication, Vehicle to Infrastructure communication, Vehicle to Home communication, and Vehicle to Pedestrian communication.

The position measurement section 7640 receives a GNSS signal from a Global Navigation Satellite System (GNSS) satellite (e.g., a GPS signal from a Global Positioning System (GPS) satellite) to perform position measurement and generates positional information including the latitude, longitude, and altitude of the vehicle. Note that the position measurement section 7640 may identify the current position by exchanging signals with a wireless access point, or may acquire positional information from a terminal such as a mobile phone, a PHS, or a smartphone having a position measurement function.

The beacon reception section 7650 receives radio waves or electromagnetic waves transmitted from a wireless station or the like installed on the road and acquires information about the current position, a traffic jam, a road closure, or a required time, for example. Note that the function of the beacon reception section 7650 may be included in the dedicated communication I/F 7630 described above.

The in-vehicle equipment I/F 7660 is a communication interface that interfaces connection between the microcomputer 7610 and various pieces of in-vehicle equipment 7760 present in the vehicle. The in-vehicle equipment I/F 7660 may establish wireless connection by using a wireless communication protocol such as wireless LAN, Bluetooth (registered trademark), Near Field Communication (NFC), or Wireless USB (WUSB). The in-vehicle equipment I/F 7660 may also establish wired connection such as Universal Serial Bus (USB), High-Definition Multimedia Interface (HDMI) (registered trademark), or Mobile High-definition Link (MHL) via a connection terminal, not illustrated in the figure (and a cable, if necessary). The in-vehicle equipment 7760 may include, for example, at least one of mobile equipment or wearable equipment held by an occupant, or information equipment carried into or attached to the vehicle. The in-vehicle equipment 7760 may also include a navigation device for searching for a route to a desired destination. The in-vehicle equipment I/F 7660 exchanges control signals or data signals with the in-vehicle equipment 7760.

The vehicle-mounted network I/F 7680 is an interface that interfaces communication between the microcomputer 7610 and the communication network 7010. The vehicle-mounted network I/F 7680 transmits and receives signals or the like in conformity with predetermined protocols supported by the communication network 7010.

The microcomputer 7610 of the integrated control unit 7600 controls the vehicle control system 7000 according to various programs based on information acquired via at least one of the general communication I/F 7620, the dedicated communication I/F 7630, the position measurement section 7640, the beacon reception section 7650, the in-vehicle equipment I/F 7660, and the vehicle-mounted network I/F 7680. For example, the microcomputer 7610 may compute a control target value for the driving force generation device, the steering mechanism, or the braking device based on acquired information internal or external to the vehicle and output a control command to the drive system control unit 7100. For example, the microcomputer 7610 may perform cooperative control for the purpose of realizing the function of Advanced Driver Assistance System (ADAS) including collision avoidance or impact mitigation for the vehicle, following traveling based on a following distance, speed-maintaining traveling, collision alert for the vehicle, lane departure alert for the vehicle, or the like. The microcomputer 7610 may also perform cooperative control for the purpose of automated driving for autonomously traveling without necessitating driver's operations, or the like, by controlling the driving force generation device, the steering mechanism, the braking device, or the like based on acquired information about the surroundings of the vehicle.

The microcomputer 7610 may generate three-dimensional distance information between the vehicle and an object such as a structure or a person around the vehicle and create local map information including ambient information of the current position of the vehicle based on information acquired via at least one of the general communication I/F 7620, the dedicated communication I/F 7630, the position measurement section 7640, the beacon reception section 7650, the in-vehicle equipment I/F 7660, and the vehicle-mounted network I/F 7680. The microcomputer 7610 may also predict a risk of collision of the vehicle, approaching of a pedestrian or the like, entry to a closed road, or the like based on acquired information and generate an alert signal. For example, the alert signal may be a signal for generating an alert sound or turning on an alert lamp.

The sound/image output section 7670 transmits an output signal as at least one of a sound and an image to an output device capable of notifying an occupant of the vehicle or the outside of the vehicle of visual or auditory information. In the example of FIG. 19, an audio speaker 7710, a display section 7720, and an instrument panel 7730 are illustrated as output devices. The display section 7720 may include, for example, at least one of an on-board display and a head-up display. The display section 7720 may have an augmented reality (AR) display function. The output device may be a device other than these devices, such as headphones, wearable device such as an eyeglass-type display worn by an occupant, a projector, or a lamp. If the output device is a display device, the display device visually displays results obtained by various types of processing performed by the microcomputer 7610 or information received from another control unit in various forms such as a text, an image, a table, or a graph. Alternatively, if the output device is a sound output device, the sound output device converts an audio signal consisting of reproduced sound data, acoustic data, or the like into an analog signal and auditorily outputs it.

Note that, in the example illustrated in FIG. 19, at least two control units connected via the communication network 7010 may be integrated as one control unit. Alternatively, an individual control unit may be composed of a plurality of control units. Further, the vehicle control system 7000 may include another control unit, not illustrated in the figure. In addition, some or all of the functions assigned to a certain control unit in the above description may be assigned to another control unit. That is, as long as information can be transmitted and received via the communication network 7010, predetermined computational processing may be performed by any control unit. Similarly, a sensor or device connected to a certain control unit may be connected to another control unit, and a plurality of control units may transmit and receive detection information to/from each other via the communication network 7010.

The technique according to the present disclosure can be applied to various pieces of equipment in charge of communication, for example, among the configurations described above.

Others

Note that the technique according to the present disclosure can take the following configurations.

[A1]

A semiconductor device including:
  a semiconductor material layer forming a channel layer;
  a pair of source/drain electrodes formed on the semiconductor material layer; and
  a gate electrode arranged between the pair of source/drain electrodes and formed on the semiconductor material layer via a gate insulating film, wherein
  a connection path using a capacitor in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes and the gate electrode.

[A2]

The semiconductor device according to [A1] above, wherein
  a conductive material layer constituting the source/drain electrodes is made of a metal material.

[A3]

The semiconductor device according to [A2] above, wherein
  one of the pair of electrodes forming the capacitor is formed by using a conductive material layer formed in the same layer as the conductive material layer constituting the source/drain electrodes, and has formed thereon the insulating film forming the capacitor.

[A4]

The semiconductor device according to any one of [A1] to [A3] above, wherein
  the other of the pair of electrodes forming the capacitor is formed by using a conductive material layer formed in the same layer as a conductive material layer constituting the gate electrode.

[A5]

The semiconductor device according to [A1] above, wherein
  one of the pair of electrodes forming the capacitor is composed of a semiconductor material electrode formed in the same layer as the semiconductor material layer forming the channel layer, and has formed thereon the insulating film forming the capacitor,
  one end of the semiconductor material electrode is connected to at least one of the pair of source/drain electrodes via an intermediate wiring formed in the same layer as a conductive material layer constituting the source/drain electrodes, and
  a width between an end portion of the intermediate wiring and an end portion of the other electrode of the capacitor is set to be narrower than a width between an end portion of the source/drain electrodes and an end portion of the gate electrode.

[A6]

The semiconductor device according to any one of [A1] to [A5] above, wherein
  a process of electrically interrupting the connection path is performed.

[A7]

The semiconductor device according to [A6] above, wherein
the electrically interrupting process is performed by removing a part of the connection path.

[A8]

The semiconductor device according to [A6] above, wherein
the electrically interrupting process is performed by increasing a resistance of a part of the connection path.

[A9]

The semiconductor device according to [A8] above, wherein
a part of the connection path is formed by using a semiconductor material layer, and
the part of the connection path formed from the semiconductor material layer is subjected to ion implantation to increase the resistance.

[A10]

The semiconductor device according to any one of [A1] to [A5] above, wherein
a connection path passing through a capacitor and a resistive element connected in series to the capacitor is formed between at least one of the pair of source/drain electrodes and the gate electrode.

[A11]

The semiconductor device according to [A10] above, wherein
the resistive element is formed by using a semiconductor material layer formed in the same layer as the semiconductor material layer forming the channel layer.

[A12]

The semiconductor device according to any one of [A1] to [A11] above, wherein
the semiconductor material layer is made of gallium nitride.

[B1]

A manufacturing method of a semiconductor device including:
a semiconductor material layer forming a channel layer;
a pair of source/drain electrodes formed on the semiconductor material layer; and
a gate electrode arranged between the pair of source/drain electrodes and formed on the semiconductor material layer via a gate insulating film, the manufacturing method including:
forming, between at least one of the pair of source/drain electrodes and the gate electrode, a connection path using a capacitor in which an insulating film formed in the same layer as the gate insulating film is sandwiched by a pair of electrodes and that undergoes dielectric breakdown at a voltage lower than a dielectric breakdown voltage of the gate insulating film.

[B2]

The manufacturing method of the semiconductor device according to [B1] above, further including
performing a process of electrically interrupting the connection path after a final plasma process in a semiconductor manufacturing process ends.

[B3]

The manufacturing method of the semiconductor device according to [B1] above, including
forming a connection path passing through a capacitor that undergoes dielectric breakdown at a voltage lower than a dielectric breakdown voltage of the gate insulating film and a resistive element connected in series to the capacitor.

[C1]

Electronic equipment including a semiconductor device including:
a semiconductor material layer forming a channel layer;
a pair of source/drain electrodes formed on the semiconductor material layer; and
a gate electrode arranged between the pair of source/drain electrodes and formed on the semiconductor material layer via a gate insulating film, wherein
a connection path using a capacitor in which an insulating film formed in the same layer as the gate insulating film is sandwiched by a pair of electrodes and that undergoes dielectric breakdown at a voltage lower than a dielectric breakdown voltage of the gate insulating film is formed between at least one of the pair of source/drain electrodes and the gate electrode.

[C2]

The electronic equipment according to [C1] above, wherein
a conductive material layer constituting the source/drain electrodes is made of a metal material.

[C3]

The electronic equipment according to [C2] above, wherein
one of the pair of electrodes forming the capacitor is formed by using a conductive material layer formed in the same layer as the conductive material layer constituting the source/drain electrodes, and has formed thereon the insulating film forming the capacitor.

[C4]

The electronic equipment according to any one of [C1] to [C3], wherein
the other of the pair of electrodes forming the capacitor is formed by using a conductive material layer formed in the same layer as the conductive material layer constituting the gate electrode.

[C5]

The electronic equipment according to [C1] above, wherein
one of the pair of electrodes forming the capacitor is composed of a semiconductor material electrode formed in the same layer as the semiconductor material layer forming the channel layer, and has formed thereon the insulating film forming the capacitor,
one end of the semiconductor material electrode is connected to at least one of the pair of source/drain electrodes via an intermediate wiring formed in the same layer as a conductive material layer constituting the source/drain electrodes, and
a width between an end portion of the intermediate wiring and an end portion of the other electrode of the capacitor is set to be narrower than a width between an end portion of the source/drain electrodes and an end portion of the gate electrode.

[C6]

The electronic equipment according to any one of [C1] to [C5] above, wherein
a process of electrically interrupting the connection path is performed.

[C7]

The electronic equipment according to [C6] above, wherein
the electrically interrupting process is performed by removing a part of the connection path.

[C8]
The electronic equipment according to [C6] above, wherein
the electrically interrupting process is performed by increasing a resistance of a part of the connection path.
[C9]
The electronic equipment according to [C8] above, wherein
a part of the connection path is formed by using a semiconductor material layer, and
the part of the connection path formed from the semiconductor material layer is subjected to ion implantation to increase the resistance.
[C10]
The electronic equipment according to any one of [C1] to [C5] above, wherein
a connection path passing through a capacitor and a resistive element connected in series to the capacitor is formed between at least one of the pair of source/drain electrodes and the gate electrode.
[C11]
The electronic equipment according to [C10] above, wherein
the resistive element is formed by using a semiconductor material layer formed in the same layer as the semiconductor material layer forming the channel layer.
[C12]
The electronic equipment according to any one of [C1] to [C11] above, wherein
the semiconductor material layer is made of gallium nitride.

REFERENCE SIGNS LIST 1, 2, 3 SEMICONDUCTOR DEVICE
10 SUBSTRATE
11 SEMICONDUCTOR MATERIAL LAYER
12, 12A PAIR OF SOURCE/DRAIN ELECTRODES
12B INTERMEDIATE WIRING
12C ONE ELECTRODE FORMING CAPACITOR
21 INTERLAYER INSULATING LAYER
22 INSULATING FILM CONSTITUTING GATE INSULATING FILM
22A GATE INSULATING FILM
22C INSULATING FILM USED FOR CAPACITOR
31 GATE ELECTRODE
31B INTERMEDIATE WIRING
31C THE OTHER ELECTRODE FORMING CAPACITOR
32 PLANARIZATION FILM
40 REMOVED PORTION OF CONNECTION PATH
211 RESISTIVE ELEMENT
311C ONE ELECTRODE FORMING CAPACITOR (SEMICONDUCTOR MATERIAL ELECTRODE)
312B INTERMEDIATE WIRING
331C THE OTHER ELECTRODE FORMING CAPACITOR
400 ELECTRONIC EQUIPMENT
410 ANTENNA SWITCH CIRCUIT
420 HIGH POWER AMPLIFIER (HPA)
430 RADIO FREQUENCY INTEGRATED CIRCUIT RFIC
440 BASEBAND SECTION
OP1, OP2 OPENING PROVIDED IN INTERLAYER INSULATING LAYER
TR PORTION OF FIELD-EFFECT TRANSISTOR WITH INSULATED-GATE STRUCTURE
$C_{S1}$ CAPACITOR
PT CONNECTION PATH

The invention claimed is:
1. A semiconductor device, comprising:
a substrate;
a semiconductor material layer on the substrate, wherein the semiconductor material layer includes a channel layer;
a pair of source/drain electrodes on the semiconductor material layer;
an interlayer insulating layer on the semiconductor material layer, wherein the interlayer insulating layer includes the pair of source/drain electrodes;
a gate insulating film;
a gate electrode between the pair of source/drain electrodes, wherein the gate electrode is on the semiconductor material layer via the gate insulating film;
a capacitor comprising a pair of specific electrodes and an insulating film, wherein the insulating film is between the pair of specific electrodes; and
a connection path, wherein
the connection path is between at least one of the pair of source/drain electrodes, and the gate electrode,
the capacitor is along the connection path in the same layer as the gate insulating film, and
the capacitor is configured to undergo dielectric breakdown at a voltage lower than a dielectric breakdown voltage of the gate insulating film.
2. The semiconductor device according to claim 1, wherein
the pair of source/drain electrodes includes a first conductive material layer, and
the first conductive material layer comprises a metal material.
3. The semiconductor device according to claim 2, wherein
one of the pair of specific electrodes includes a second conductive material layer,
the second conductive material layer is in the same layer as the first conductive material layer, and
the insulating film is further on one of the pair of specific electrodes.
4. The semiconductor device according to claim 1, wherein
one of the pair of specific electrodes includes a first conductive material layer, and
the first conductive material layer is in the same layer as a second conductive material layer constituting the gate electrode.
5. The semiconductor device according to claim 1, further comprising an intermediate wiring, wherein
one of the pair of specific electrodes is a semiconductor material electrode,
the semiconductor material electrode is in the same layer as the semiconductor material layer,
the insulating film is on the semiconductor material electrode,
one end of the semiconductor material electrode is connected to at least one of the pair of source/drain electrodes via the intermediate wiring,
the pair of source/drain electrodes includes a first conductive material layer,
the intermediate wiring is in the same layer as the first conductive material layer, and
a width between an end portion of the intermediate wiring and an end portion of the one of the pair of specific electrodes is narrower than a width between an end portion of the pair of source/drain electrodes and an end portion of the gate electrode.

6. The semiconductor device according to claim 1, wherein the semiconductor material layer comprises gallium nitride.

7. An electronic equipment including a semiconductor device, wherein the semiconductor device comprising:
a substrate;
a semiconductor material layer on the substrate, wherein the semiconductor material layer includes a channel layer;
a pair of source/drain electrodes on the semiconductor material layer;
an interlayer insulating layer on the semiconductor material layer, wherein the interlayer insulating layer includes the pair of source/drain electrodes;
a gate insulating film;
a gate electrode between the pair of source/drain electrodes, wherein the gate electrode is on the semiconductor material layer via the gate insulating film;
a capacitor comprising a pair of specific electrodes and an insulating film, wherein the insulating film is between the pair of specific electrodes; and
a connection path, wherein
the connection path is between at least one of the pair of source/drain electrodes, and the gate electrode,
the capacitor is along the connection path in the same layer as the gate insulating film, and
the capacitor is configured to undergo dielectric breakdown at a voltage lower than a dielectric breakdown voltage of the gate insulating film.

* * * * *